(12) United States Patent
Yamaguchi

(10) Patent No.: US 7,239,484 B2
(45) Date of Patent: Jul. 3, 2007

(54) MOUNTING METHOD OF MAGNETIC HEAD COMPONENT, MAGNETIC HEAD DEVICE AND MANUFACTURING METHOD OF MAGNETIC HEAD DEVICE UTILIZING SOLDER BALLS WITH NONMELTING CORES

(75) Inventor: Satoshi Yamaguchi, Kwai Chung (HK)

(73) Assignee: SAE Magnetics (H.K.) Ltd., Kwai Chung, N.T. (HK)

( * ) Notice: Subject to any disclaimer, the term of this patent is extended or adjusted under 35 U.S.C. 154(b) by 502 days.

(21) Appl. No.: 10/788,438

(22) Filed: Mar. 1, 2004

(65) Prior Publication Data
US 2005/0195527 A1 Sep. 8, 2005

(30) Foreign Application Priority Data
Mar. 3, 2003 (JP) .............................. 2003-055496
Jan. 21, 2004 (JP) .............................. 2004-013289

(51) Int. Cl.
*G11B 5/60* (2006.01)

(52) U.S. Cl. ............................... 360/234.5; 360/245.8; 228/180.22

(58) Field of Classification Search ................ None
See application file for complete search history.

(56) References Cited

U.S. PATENT DOCUMENTS

| 5,821,494 | A | * | 10/1998 | Albrecht et al. ....... 219/121.64 |
| 5,828,031 | A | | 10/1998 | Pattanaik |
| 6,610,591 | B1 | * | 8/2003 | Jiang et al. ................ 438/613 |
| 7,086,147 | B2 | * | 8/2006 | Caletka et al. ............... 29/840 |

FOREIGN PATENT DOCUMENTS

JP 2002-50017 2/2002

* cited by examiner

*Primary Examiner*—A. J. Heinz
(74) *Attorney, Agent, or Firm*—Oblon, Spivak, McClelland, Maier & Neustadt, P.C.

(57) ABSTRACT

A magnetic head slider or a precise positioning actuator is electrically and mechanically connected to a suspension, by performing molten-solder connections using solder balls with cores that will not melt even at a solder-melting temperature.

27 Claims, 19 Drawing Sheets

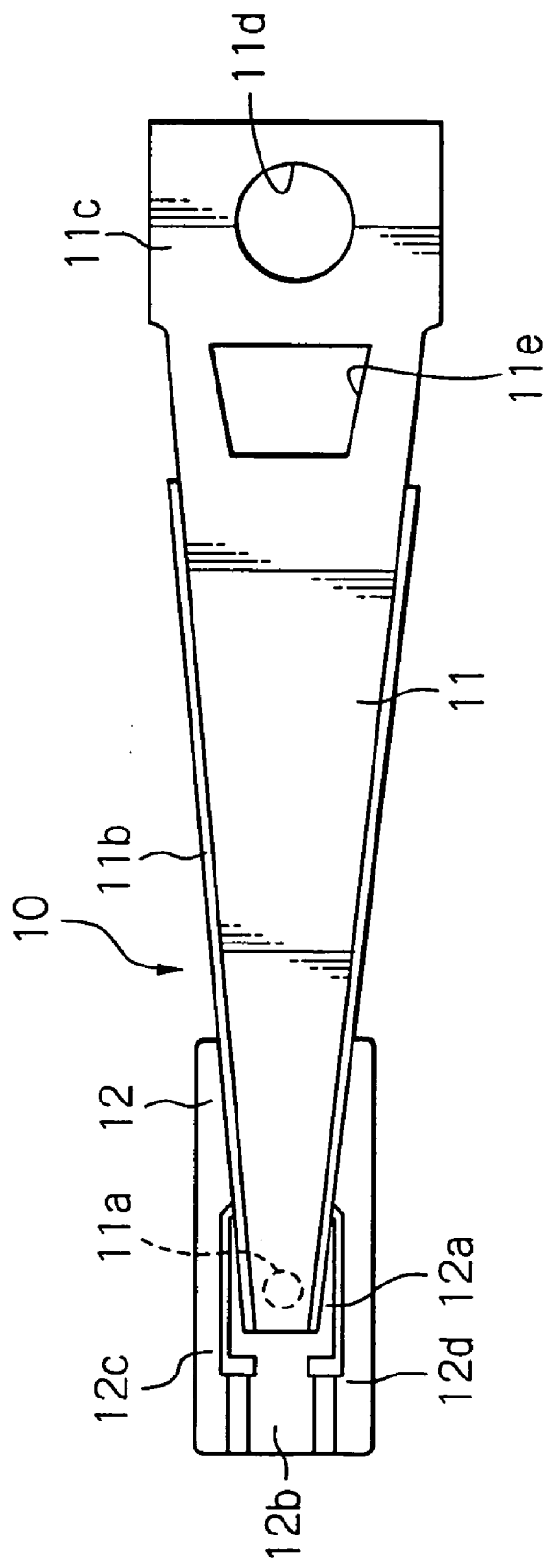

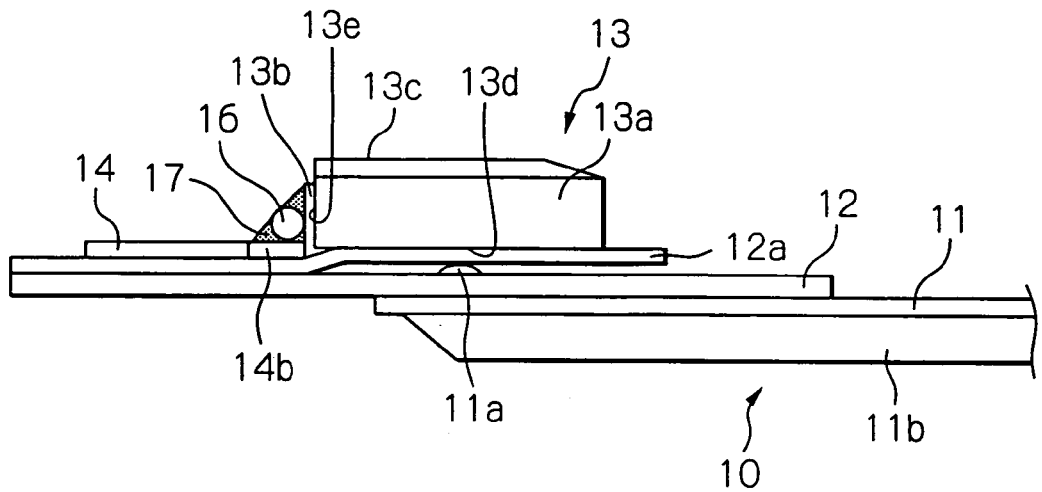
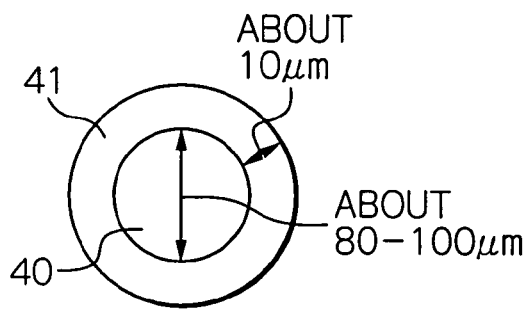
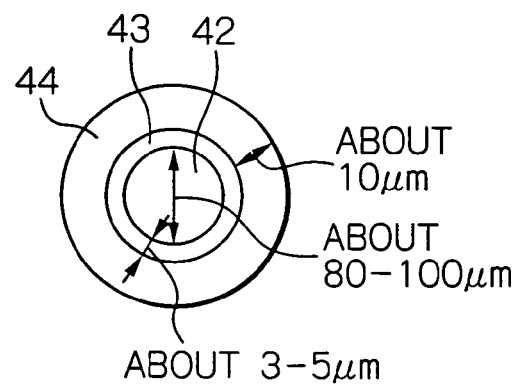
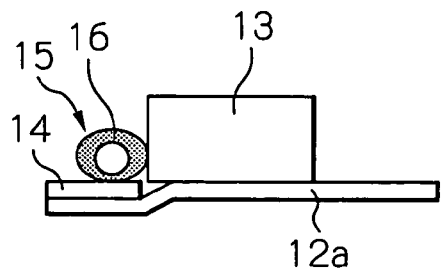
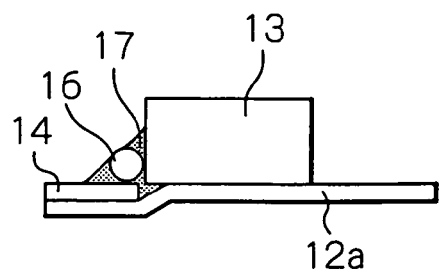

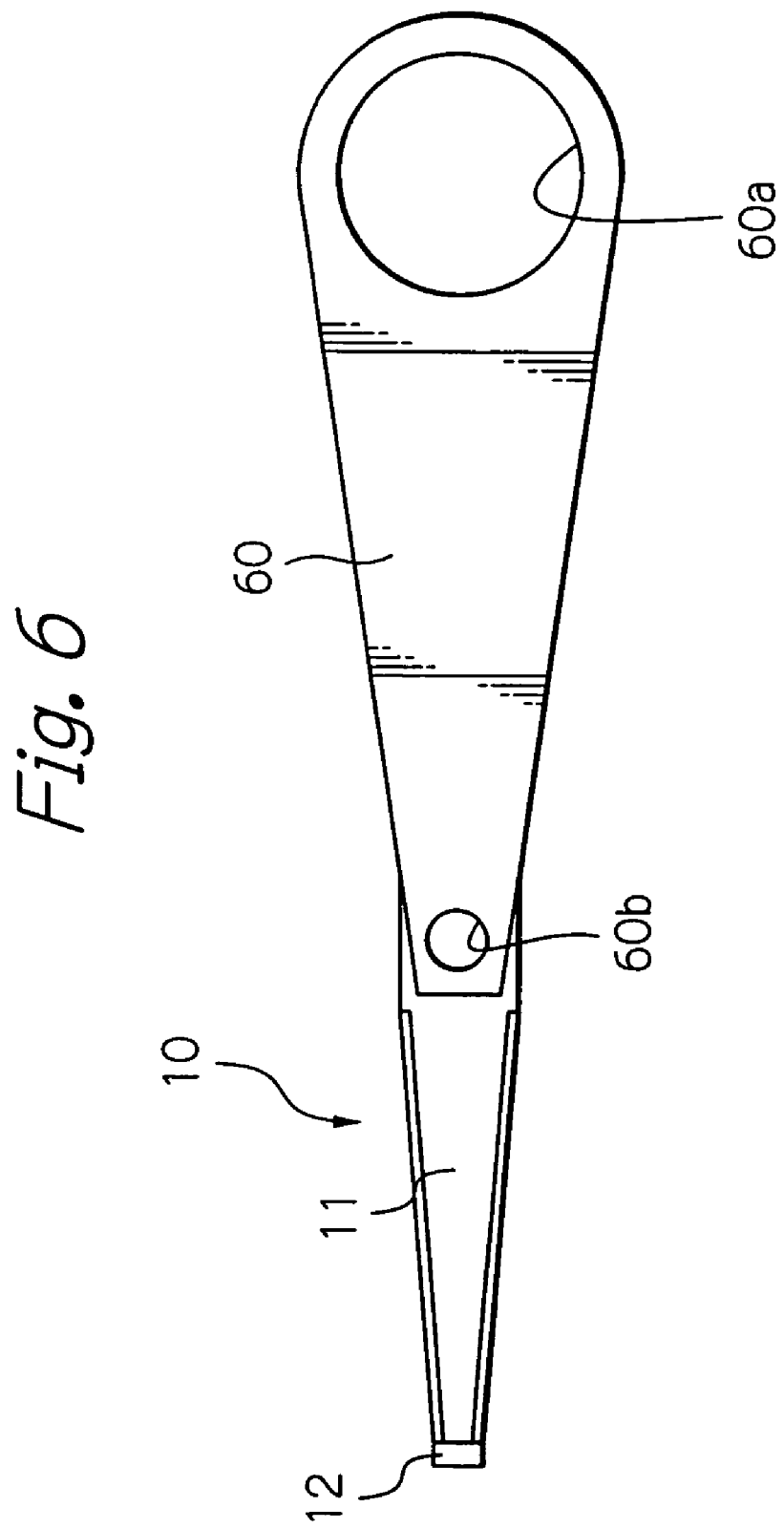

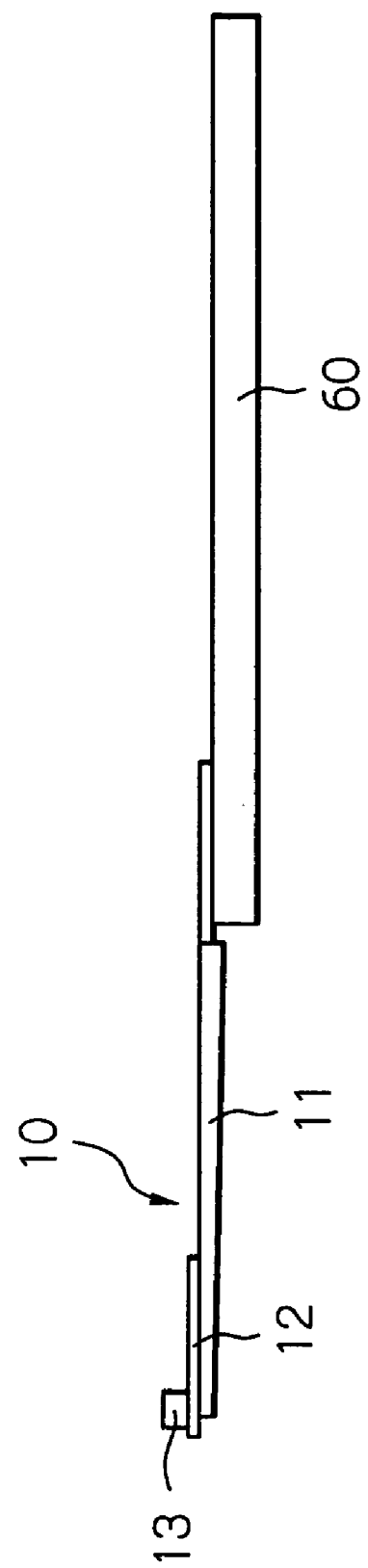

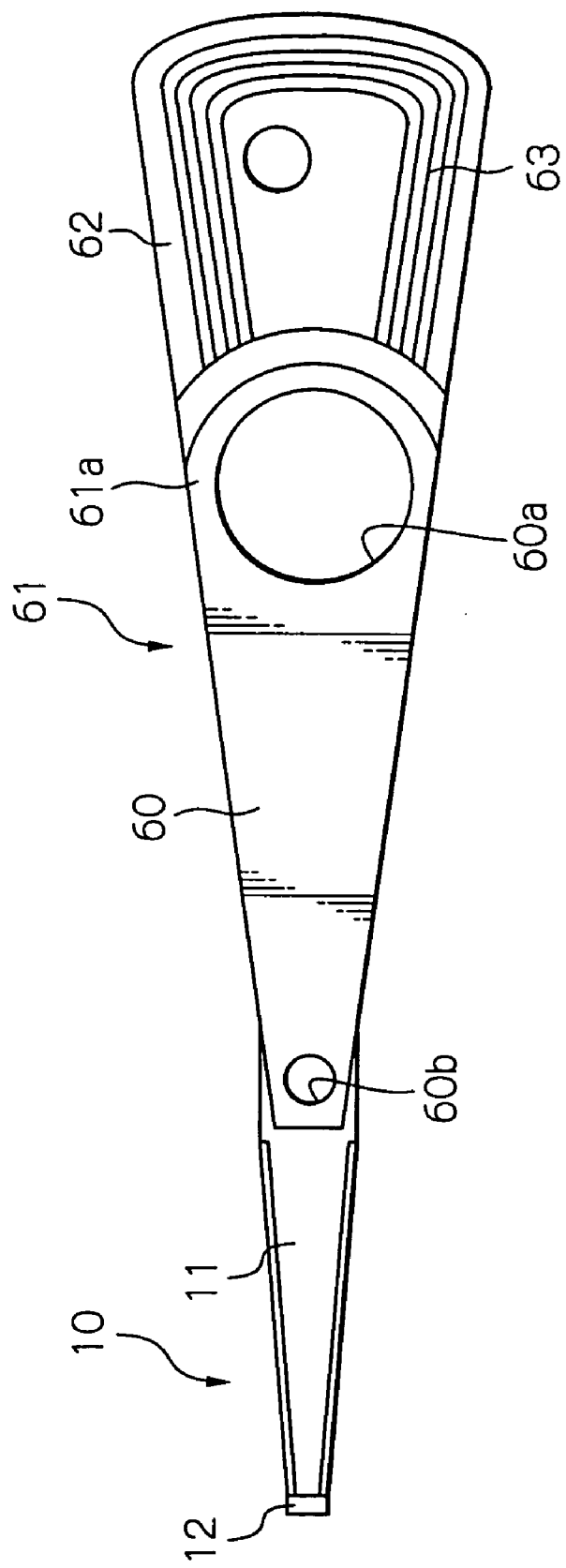

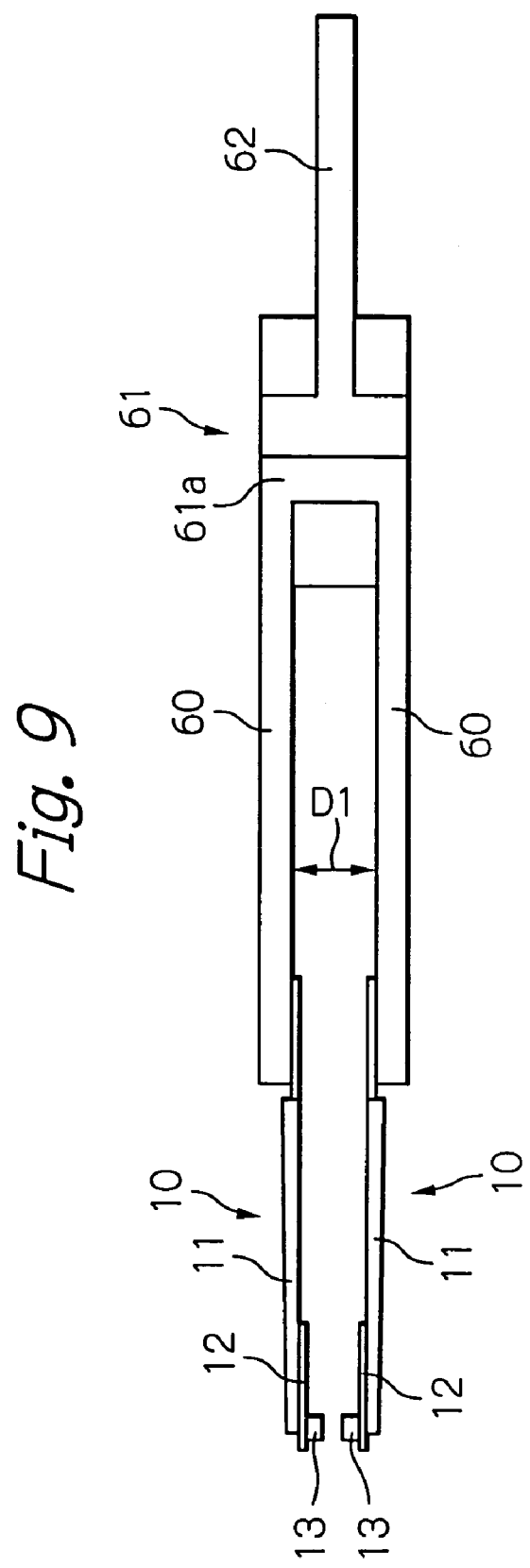

MOUNTING METHOD OF MAGNETIC HEAD COMPONENT, MAGNETIC HEAD DEVICE AND MANUFACTURING METHOD OF MAGNETIC HEAD DEVICE UTILIZING SOLDER BALLS WITH NONMELTING CORES

BACKGROUND OF THE INVENTION

1. Field of the Invention

The present invention relates to a mounting method of a magnetic head component, to a magnetic head device and to a manufacturing method of a magnetic head device. Particularly, the present invention relates to a mounting method of a magnetic head component such as a flying-type magnetic head slider with at least one magnetic write head element and/or at least one magnetic read head element or a micro-actuator, to a magnetic head device and to a manufacturing method of a magnetic head device.

2. Description of the Related Art

There are three practical variations of a flying-type magnetic head device in a magnetic disk drive apparatus, that is, a head gimbal assembly (HGA) with a suspension and a magnetic head slider attached on the suspension, a head arm assembly (HAA) with a support arm and at least one HGA attached to the support arm, and a head stack assembly (HSA) with a plurality of HAAs stacked on each other.

A typical HGA has a suspension and a magnetic head slider fixed on the suspension by a resin adhesive. Terminal pads of the magnetic head slider are electrically connected by solder with connection pads of trace conductors supported by the suspension. Thus, the magnetic head slider is fixed to the suspension by both the resin adhesive and the solder. Such structure is known by for example Japanese patent publication No. 2002-050017A.

A solder reflow method is known as for a method of electrically connecting terminal pads of a magnetic head slider and lead conductors of a suspension with each other and as for a method of detaching the magnetic head slider from the suspension in order to reuse. The solder reflow method is very popularly used for the solder connection because it is possible to provide high adhesion strength. Particularly, in the HGA process, a laser reflow method for reflowing the solder by means of a laser beam is utilized. Such laser reflow method is disclosed in for example Japanese patent publication No. 2002-050017A and U.S. Pat. No. 5,828,031.

The laser reflow method disclosed in U.S. Pat. No. 5,828,031 has a process of providing a solder ball via a capillary to place it between the terminal pad of the magnetic head slider and the lead connection pad on the suspension, and a process of supplying a laser beam through the capillary to melt the solder ball so as to make solder connection between the terminal pad and the lead connection pad.

However, if conventional solders ball are used for the solder connection between the terminal pad of the magnetic head slider and the lead connection pad on the suspension, it is quite difficult to control the shape of the solder portion. That is, since each solder ball is very small in size and lead-free solder is popularly used as the solder ball, solder shape control may be close to impossible. Attached roll and/or pitch angle of the magnetic head slider after the solder connection with respect to the suspension may greatly change due to such as shrink-distortion occurring when the molten solder is solidified. Such great change in the attached angle may deteriorate flying performance of the magnetic head slider and therefore output characteristics of the magnetic head. Also, lack of the solder shape control will make difficult a so-called rework process for detaching a magnetic head slider with the deteriorated output characteristics from a suspension and for attaching a new magnetic head slider to the reused suspension.

BRIEF SUMMARY OF THE INVENTION

It is therefore an object of the present invention to provide a mounting method of a magnetic head component, a magnetic head device and a manufacturing method of a magnetic head device, whereby shape change of a magnetic head slider and damages applied to the slider during a solder reflow can be reduced.

Another object of the present invention is to provide a mounting method of a magnetic head component, a magnetic head device and a manufacturing method of a magnetic head device, whereby a rework process of a magnetic head slider can be easily performed.

According to the present invention, a mounting method of a magnetic head component includes electrical and mechanical connection of a magnetic head slider or a precise positioning actuator to a suspension. This connection is performed by molten-solder connections using solder balls with cores that will not melt even at a solder-melting temperature.

The molten-solder connections can be performed with keeping the shape of each core of the solder ball as it is because the core will not melt even when the temperature rises to a solder-melting temperature or more. Therefore, the solder connections can be very easily controlled. Also, since the shape of the solder connections is stable, variations in roll angle and pitch angle of the magnetic head slider, which variations may occur during the solder connection, can be reduced and stabilized. As a result, flying performance of the magnetic head slider and therefore its output characteristics can be kept stable. Furthermore, because of stable shape of the solder connections, rework of the magnetic head device after the solder reflow connections becomes easy.

It is preferred that the connecting step includes placing each of the solder balls to contact at least one of a terminal pad formed on the magnetic head slider or on the precise positioning actuator and a connection pad formed on a lead conductor member supported by the suspension, and thereafter performing the molten-solder connections.

It is also preferred that the connecting step includes performing the molten solder by laser reflowing.

It is preferred that the providing step includes providing solder balls with cores, each core having a surface layer that is in contact with solder, and that at least the surface layer of each core is made of a conductive material. In this case, preferably, the conductive material contains at least copper.

It is also preferred that the providing step includes providing solder balls with cores, and that the whole of each core is made of a conductive material. In this case, preferably, the conductive material contains at least copper.

It is further preferred that the providing step includes providing solder balls with cores, each core having a surface layer and an inside body, and that the surface layer of each core is made of a conductive material and the inside body of each core is made of a resin material. In this case, preferably, the conductive material contains at least copper.

It is preferred that the providing step includes providing solder balls with cores, each core having a surface layer that is in contact with solder, and that at least the surface layer of each core is made of a material with a high solder wettability and a high thermal conductivity.

It is also preferred that the providing step includes providing solder balls with cores, and that each core constitutes 30–70% of the whole of each solder ball by volume.

It is further preferred that the providing step includes providing solder balls with cores, and that each core has a diameter smaller than a longitudinal direction length of each terminal pad formed on the magnetic head slider or on the precise positioning actuator.

It is still further preferred that the method further includes a step of mechanically fixing the magnetic head slider to the suspension, by performing molten-solder connections between dummy terminal pads formed on the magnetic head slider and dummy pads formed on the suspension using solder balls with cores that will not melt even at a solder-melting temperature. In this case, preferably, the fixing step includes grounding the dummy terminal pads.

According to the present invention, also, a magnetic head device includes a magnetic head slider with at least one magnetic head element and terminal pads electrically connected to the at least one magnetic head element, and a suspension with connection pads electrically connected to the terminal pads. The terminal pads and the connection pads are electrically connected with each other by molten-solder connections using solder balls with cores that will not melt even at a solder-melting temperature.

The molten-solder connections can be performed with keeping the shape of each core of the solder ball as it is because the core will not melt even when the temperature rises to a solder-melting temperature or more. Therefore, variations in roll angle and pitch angle of the magnetic head slider, which variations may occur during the solder connection, can be reduced and stabilized. As a result, flying performance of the magnetic head slider and therefore its output characteristics can be kept stable.

It is preferred that the device further includes a precise positioning actuator connected to the suspension by molten-solder connections using solder balls with cores that will not melt even at a solder-melting temperature.

It is also preferred that the magnetic head slider has dummy terminal pads on its first surface and the suspension has dummy pads, and that the dummy terminal pads and the dummy pads are electrically connected with each other by molten-solder connections using solder balls with cores that will not melt even at a solder-melting temperature. In this case, preferably, the dummy terminal pads are grounded. Further, it is preferred that the dummy terminal pads are formed on a second surface of the magnetic head slider, which is opposite to the first surface.

It is preferred that each core has a surface layer that is in contact with solder, and that at least the surface layer of each core is made of a conductive material. In this case, preferably, the conductive material contains at least copper.

It is also preferred that the whole of each core is made of a conductive material. In this case, preferably, the conductive material contains at least copper.

It is preferred that each core has a surface layer and an inside body, and that the surface layer of each core is made of a conductive material and the inside body of each core is made of a resin material. In this case, preferably, the conductive material contains at least copper.

It is also preferred that each core has a surface layer that is in contact with solder, and that at least the surface layer of each core is made of a material with a high solder wettability and a high thermal conductivity.

It is further preferred that each core constitutes 30–70% of the whole of each solder ball by volume.

It is still further preferred that the each core has a diameter smaller than a longitudinal direction length of each terminal pad of the magnetic head slider.

According to the present invention, furthermore, a manufacturing method of a magnetic head device, includes a step of placing a magnetic head slider with at least one magnetic head element and terminal pads electrically connected to the at least one magnetic head element on a suspension with connection pads, and a step of electrically connecting the terminal pads of the magnetic head slider to the connection pads of the suspension, by performing molten-solder connections using solder balls with cores that will not melt even at a solder-melting temperature.

The molten-solder connections can be performed with keeping the shape of each core of the solder ball as it is because the core will not melt even when the temperature rises to a solder-melting temperature or more. Therefore, the solder connections can be very easily controlled. Also, since the shape of the solder connections is stable, variations in roll angle and pitch angle of the magnetic head slider, which variations may occur during the solder connection, can be reduced and stabilized. As a result, flying performance of the magnetic head slider and therefore its output characteristics can be kept stable. Furthermore, because of the stable shape of the solder connections, reworking of the magnetic head device after the solder reflow connections becomes easy to accomplish.

It is preferred that the method further includes a step of testing characteristics of the magnetic head device after performing the molten-solder connections so as to judge whether the magnetic head device is defective, and a step of reworking the magnetic head device when it is judged as defective.

It is also preferred that the method further includes a step of testing characteristics of the magnetic head device before performing molten-solder connections where the solder balls are tentatively attached between the terminal pads and the connection pads so as to judge whether the magnetic head device is defective, and a step of performing the molten-solder connections when it is judged as not defective and performing rework of the magnetic head device when it is judged as defective.

Further objects and advantages of the present invention will be apparent from the following description of the preferred embodiments of the invention as illustrated in the accompanying drawings.

BRIEF DESCRIPTION OF THE SEVERAL VIEWS OF THE DRAWINGS

FIG. 2 is a plane view of the HGA shown in FIG. 1 seen from the opposite side of the slider-mounting side;

FIG. 3 is an enlarged side view of a top end section of the HGA shown in FIGS. 1 and 2;

FIGS. 4a and 4b are sectional views illustrating two structures of solder balls with cores;

FIGS. 5a and 5b are sectional views illustrating electrical and mechanical connection configurations between a terminal pad of a magnetic head slider and a connection pad of a lead conductor member using the solder ball with core, in the embodiment of FIG. 1;

FIG. 6 is a plane view of an HAA constituted by attaching the HGA in the embodiment of FIG. 1 to a support arm, seen from the opposite side of the slider-mounting side;

FIG. 7 is a side view of the HAA shown in FIG. 6;

FIG. 8 is a plane view of an HSA constituted by stacking a plurality of the HAAs shown in FIGS. 6 and 7, seen from the opposite side of the slider-mounting side;

FIG. 9 is a side view of the HSA shown in FIG. 8;

DETAILED DESCRIPTION OF THE PREFERRED EMBODIMENTS

Figure 1:
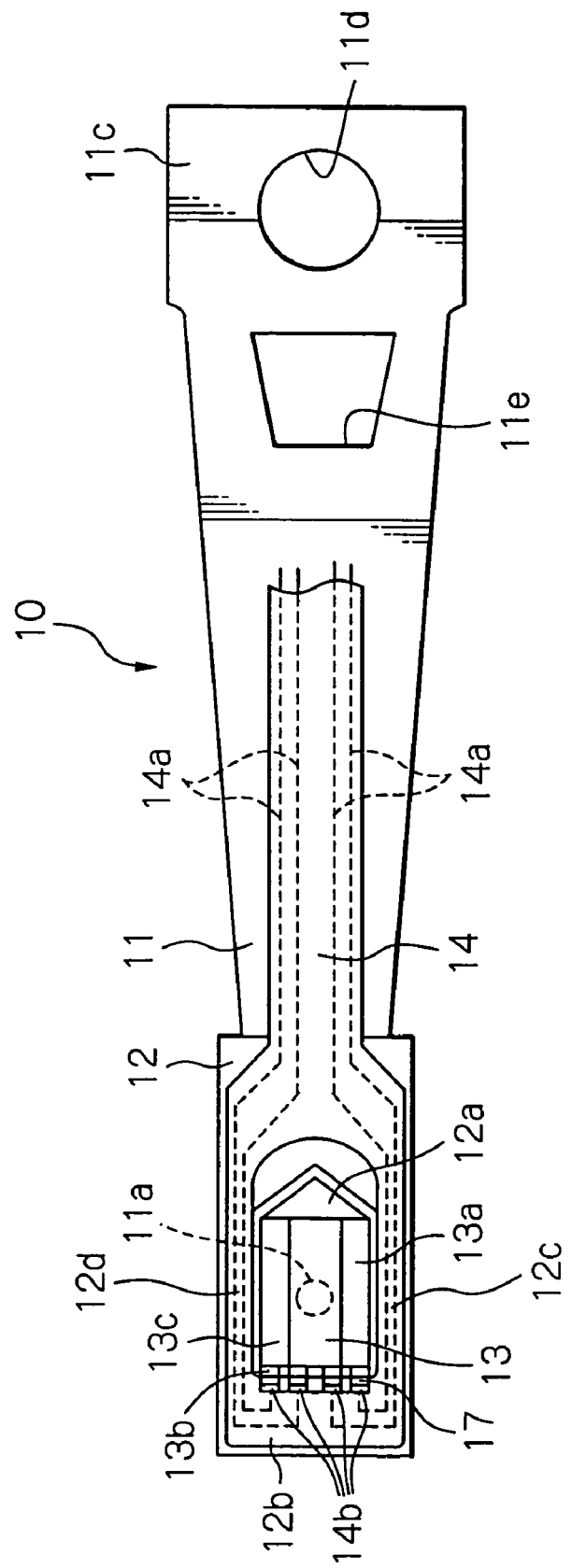
FIG. 1 is a plane view of an HGA seen from a slider-mounting side as a preferred embodiment of a magnetic head device according to the present invention.

FIG. 1 illustrates an HGA as seen from a slider-mounting side as a preferred embodiment of a magnetic head device according to the present invention, FIG. 2 illustrates the HGA shown in FIG. 1 as seen from the opposite side of the slider-mounting side, and FIG. 3 illustrates an enlarged top end section of the HGA shown in FIGS. 1 and 2.

As shown in these figures, the HGA has a suspension 10 mainly constituted by a load beam 11 with a relatively high stiffness and a resilient flexure 12, a magnetic head slider 13 fixed on the suspension 10, and a lead conductor member 14 formed on or fixed to the suspension 10.

The load beam 11 has a protrusion or dimple 11a for applying a load to the magnetic head slider 13. This dimple 11a is positioned on the longitudinal center axis line near a free end section or top end section of the load beam 11. As shown in FIGS. 2 and 3, the load beam 11 also has bent sections or ribs 11b at both side edges for increasing stiffness of the corresponding section of the load beam 11. The load beam 11 further has at its rear end section an attachment section 11c with an attachment via hole 11d used for fixing the load beam 11 to a support arm, and a via hole 11e, formed near the attachment via hole 11d, for reducing the whole weight of the load beam 11.

The flexure 12 is formed by a thin spring plate. One surface (first surface) of the flexure 12 is attached by swaging to a surface of the load beam 11, from which surface the protrusion 11a juts to receive a pressed load from the protrusion 11a. The magnetic head slider 13 is attached to the other surface (second surface) of the flexure 12. Instead of swaging, the flexure 12 may be attached by spot welding to the first surface of the load beam 11.

The flexure 12 has at its center a tongue 12a. Only one end of the tongue 12a is integrally coupled with a lateral frame 12b located at a top end of the flexure 12, and the other end of the tongue 12a is free end. Both ends of the lateral frame 12b are integrally coupled with outer frames 12c and 12d of the flexure 12, respectively. Side ends of the tongue 12a are separated from the outer frames 12c and 12d, and the other end of the tongue 12a is also separated from the flexure 12. Top end of the protrusion 11a of the load beam 11 abuts on one surface (first surface) of the tongue 12a. On the other surface (second surface) of the tongue 12a of the flexure 12, the magnetic head slider 13 is mechanically fixed only by solder ball connection described below, that is, the connection using solder balls with cores between terminal pads of the magnetic head slider and connection pads of the lead conductor member, or by both the solder ball connection and adhesive connection.

The magnetic head slider 13 has a slider body 13a, a magnetic write head element of an inductive element in this embodiment, a magnetic read head element of a giant magnetoresistive effect (GMR) element in this embodiment, and a plurality of (four in this case) terminal pads or bumps 13b electrically connected to these magnetic write and read head elements.

One surface 13d of the slider body 13a, opposite to its air bearing surface (ABS) 13c is attached to the other surface (second surface) of the tongue 12a of the flexure 12. On an element formed surface 13e of the slider body 13a, the terminal pads 13b are formed.

The lead conductor member 14 is supported by the flexure 12 and the load beam 11 of the suspension 10 and has a plurality of (four in this case) trace conductors 14a, and a plurality of (four in this case) connection pads or lead pads 14b. The trace conductors 14a are embedded in a flexible insulation support layer and one ends of the trace conductors 14a are connected to the respective connection pads 14b. These connection pads 14b are formed on the flexure 12 at locations corresponding to these of the terminal pads 13b of the magnetic head slider 13, respectively. Typical example of such lead conductor member 14 is a so-called tub tape.

The terminal pads 13b of the magnetic head slider 13 and the connection pads 14b of the lead conductor member 14 are connected with each other by reflowed solders 17, respectively. Each reflowed solder 17 is formed by laser reflowing of a solder ball 15 supplied at an exposed corner or juncture between the second surface of the flexure 12 and the element formed surface 13e of the slider body 13a as shown in FIG. 3, for example. By means of this solder connection of the terminal pads 13b of the magnetic head slider 13 with the connection pads 14b of the lead conductor member 14, the magnetic write head element and the magnetic read head element of the magnetic head slider 13 are electrically connected with the trace conductors 14a of the lead conductor member 14.

The important feature of the present invention is using of a solder ball with a sphere core 16 inside, which will not melt even at a solder-melting temperature, as each solder ball 15.

FIGS. 4a and 4b illustrate two structure examples of such solder balls with cores.

In the example of FIG. 4a, the whole of a sphere core 40 is made of metal material containing at least copper, such as copper or copper alloy, and a solder layer 41 are coated to cover the entire surface of the core 40. In this example, a diameter of the core 40 is about 80–100 μm, a thickness of the solder layer 41 is about 10 μm and a total diameter of the solder ball is about 100–120 μm. It is necessary that a volume of the core 40 is 30–70% of the total volume of the solder ball. Also, it is desired that the diameter of the core 40 is smaller than a longitudinal direction length of the terminal pad 13b of the magnetic head slider 13 and than a longitudinal direction length of the connection pad 14b of the lead conductor member 14. As will be noted from FIG. 3, when such solder ball with a core is used, actual soldering portion will be concentrated on the upper region of each terminal pad 13b of the magnetic head slider 13. Thus, if the diameter of the core 40 is large, an area used for the soldering connection decreases. Therefore, in order to secure enough solder connection area, it is preferred that the diameter or height of the core 40 is smaller than the longitudinal direction length or height of the terminal pad 13b. Due to the similar reasons, it is preferred that the diameter of the core 40 is smaller than the longitudinal direction length of the connection pad 14b of the lead conductor member 14. Any material other than the metal material can be used as the core 40 on conditions that it will not melt even when the temperature rises to a solder-melting temperature or more. For example, the core 40 may be made of a resin material. Preferably, the material of the core 40 is that with an excellent solder wettability and with a high thermal conductivity. As for solder balls with resin material cores, plastic core solder balls called Micropearl SOL provided from Sekisui Chemical Co., Ltd. may be used.

In the example of FIG. 4b, a sphere core 42 is made of resin material, a layer 43 of metal material containing at least copper, such as copper or copper alloy is plated to cover the surface of the core 42, and a solder layer 44 is coated to cover the entire outer surface of the plated metal layer 43. The plated metal layer 43 may be formed to cover the entire surface of the core 42, or to cover a partial surface used for solder connection, of the core 42. In this example, a diameter of the core 42 is about 80–100 μm, a thickness of the plated metal layer 43 is about 3–5 μm, a thickness of the solder layer 44 is about 10 μm, and a total diameter of the solder ball is about 100–120 μm. It is necessary that a volume of the core 42 and the plated metal layer 43 is 30–70% of the total volume of the solder ball. In this example, due to the same reason as mentioned in the example of FIG. 4a, it is desired that the diameter of the core 42 is smaller than a longitudinal direction length of the terminal pad 13b of the magnetic head slider 13 and than a longitudinal direction length of the connection pad 14b of the lead conductor member 14. Any material other than the resin material can be used as the core 42 on conditions that it will not melt even at a solder-melting temperature. As for the material of the layer 43, any material other than the copper containing metal material such as copper or copper alloy may be used, on conditions that the material has an excellent solder wettability and a high thermal conductivity.

FIGS. 5a and 5b illustrate electrical and mechanical connection configurations between the terminal pad of the magnetic head slider and the connection pad of the lead conductor member using such solder ball with a core.

FIG. 5a shows a pre-bump or pre-reflowed state before full solder reflowing. This pre-reflowed state is attained by placing solder balls 15 with cores 16 inside between the terminal pads of the magnetic head slider 13 and the connection pads of the lead conductor member 14 so that the solder balls abut to the surfaces of the terminal pads and the connection pads, and then by partially melting the solder layers of the solder balls to provide tentative solder connections as a result of irradiation of a low energy laser beam. FIG. 5b on the other hands shows a bump or reflowed state with fully reflowed solders 17. This reflowed state is attained by reflowing the solder balls 15 placed between the terminal pads of the magnetic head slider 13 and the connection pads of the lead conductor member 14 by irradiating a laser beam so as to fully melt the solder layers of the solder balls 15. Since the cores 16 are not molten, the solder connection can be executed with keeping the core shape.

According to the present invention, since the solder balls with such cores are used, the shape of the solder connections becomes stable. Thus, variations in roll angle and pitch angle of the magnetic head slider, which variations may occur during the solder connection, can be reduced and stabilized. As a result, flying performance of the magnetic head slider and therefore its output characteristics can be kept stable.

Using of the solder balls with cores presents easy rework of the HGA even if the connections between the magnetic head slider and the suspension are in the reflowed state after solder reflowing. When a magnetic write head element and/or a magnetic read head element of a magnetic head slider is judged as malfunction at the characteristics test, the rework is done to exchange the malfunctioned magnetic head slider to new one while reusing the suspension. The rework when the connections are in the reflowed state after solder reflowing is in general performed by re-melting the solder under the reflowed state so that the magnetic head slider 13 is detachable from the flexure 12 of the suspension 10. In this reworking process, according to the present invention, since the solder balls with cores, in which a balance of the core and the solder layer will be appropriately determined, are used, shape of each solder connection is kept in the core shape even if it is in reflowed state. Thus, extremely easy rework process can be expected. Particularly, when a solder removing method of re-melting the solder by for example laser beam heating and sucking the molten solder by a vacuum nozzle is used, the molten solder can be removed by sucking the core to which the molten solder is attached. As a result, a stable amount of solder can be removed and damage applied to the reusing suspension can be reduced. Also, the solder surface on the connection pad can become easily flattened. If the solder connection was performed with no core as the conventional art, the solder removing was very difficult because it depends on the shape of the suspension and on the solder connection shape.

Furthermore, using of the solder balls with cores presents stably kept shape and area for each solder ball to ease their control even if the connections are in pre-reflowed state before solder reflowing. Therefore, when the HGA is reworked under this pre-reflowed state, detachment of the malfunctioned magnetic head slider from the suspension becomes greatly easier. If the magnetic write head element and/or the magnetic read head element of the magnetic head slider is judged as good at the characteristics test, the HGA will not be reworked but will be reflowed to melt the solder balls and to make solder connections.

According to the present invention, also, since the solder balls are placed at corners between the tongue 12a of the flexure 12 and the element formed surface 13e of the slider body 13a, heat such as laser beam heat applied from outside can be concentrated to the solder balls. Thus, during the solder reflow process for solder connections or detachment of the magnetic head slider 13, possible thermal damage to the GMR element on the magnetic head slider 13 can be minimized. If the magnetic head slider 13 is fixed to the suspension 10 only by the solder connections with using no resin adhesive, it is possible to prevent shape change in the magnetic head slider due to the difference in thermal expansion coefficients between the resin adhesive and the magnetic head slider, and thus to prevent deterioration in the flying performance of the slider.

FIG. 6 illustrates an HAA constituted by attaching the HGA to a support arm, seen from the opposite side of the slider-mounting side, and FIG. 7 shows the side view of the HAA.

As shown in these figures, the HAA is mainly configured by the HGA with the suspension 10 and the magnetic head slider 13, and the support arm 60. The support arm 60 is integrally formed or molded by an appropriate nonmagnetic metal material with a high stiffness such as an aluminum alloy for example. This support arm 60 has attachment holes 60a and 60b. The attachment hole 60a is used for attaching this support arm 60 to a bearing mechanism that allows the arm 60 to rotate around the bearing mechanism in parallel with the disk surface. The attachment hole 60b is used for attaching the HGA to this support arm 60. Namely, the attachment via hole 11d (FIGS. 1 and 2) of the HGA is attached to the attachment hole 60b by a swaging mechanism or a ball-connection mechanism for example to fix the HGA to the support arm 60.

FIG. 8 illustrates an HSA constituted by stacking a plurality of the HAAs shown in FIGS. 6 and 7, seen from the opposite side of the slider-mounting side, and FIG. 9 shows a side view of the HAS.

As shown in these figures, the HSA is mainly configured by a plurality, two in this case, of the HGAs each having the suspension 10 and the magnetic head slider 13, and a support block 61. The support block 61 has a plurality, two in this case, of the support arms 60. These two support arms 60 are protruded from a base 61a of the support block 61 in parallel with each other, and stacked at a space D1 away. At a top end section of each support arm 60, the HGA is attached as aforementioned. The base 61a and the support arms 60 are integrally formed or molded by an appropriate nonmagnetic metal material such as an aluminum alloy for example. The number of the stacked support arms may be three or more.

The base 61a has an attachment hole 60a running along the stacking direction of the support arms 60. This attachment hole 60a is used for attaching the support block 61 to a bearing mechanism that allows the block 61 to rotate around the bearing mechanism in parallel with the disk surface. To the base 61a of the support block 61, a coil support member 62 and a voice coil 63 of a voice coil motor (VCM) used for positioning the magnetic head slider 13 are attached.

In the embodiment shown in the figures, the single HGA is attached to one surface of each support arm 60. However, two HGAs may be attached to both surfaces of each support arm 60, respectively. In most cases of three or more support arms 60 are provided, two HGAs are attached to both surfaces of each support arm 60.

Hereinafter, manufacturing processes of the HGA of this embodiment according to the present invention will be described.

Figure 10:
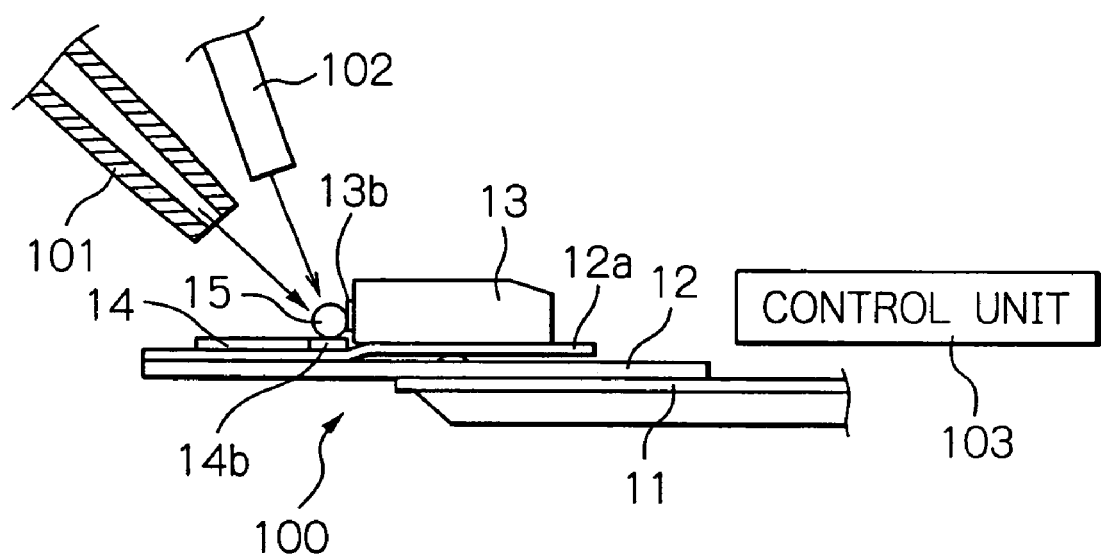
FIG. 10 is a side view illustrating schematic structure of a manufacturing apparatus used for fabricating the HGA of the embodiment of FIG. 1.

FIG. 10 illustrates schematic structure of a manufacturing apparatus used for fabricating the HGA of this embodiment.

As shown in the figure, the manufacturing apparatus of an HGA 100 is provided with a solder ball supply unit or connection ball supply unit 101, a laser beam supply unit 102 and a control unit 103 for controlling these units 101 and 102.

The HGA 100 itself has the structure as shown in FIGS. 1–3. The present invention can be adopted in the HGA itself, the HAA shown in FIGS. 6 and 7, the HSA shown in FIGS. 8 and 9, and a magnetic disk drive apparatus with the HAA or HSA.

The solder ball supply unit 101 supplies solder balls to junctions between the terminal pads 13b of the magnetic head slider 13 and the connection pads 14b of the lead conductor member 14, respectively. This unit 101 may be for example a Solder Ball Bumper (SBB) of Pac Tech GmbH (URL:www.pactech.de), or a Solder Jet Printer System (SJPS) of MicroFab Technologies, Inc. (URL:www.microfab.com). The SBB places the solder balls on the junctions, whereas the SJPS injects molten solder balls to the junctions.

The laser beam supply unit 102 irradiates a focused laser beam to each of the junctions between the terminal pads 13b of the magnetic head slider 13 and the connection pads 14b of the lead conductor member 14, and to the solder balls 15 supplied to the junctions by the solder ball supply unit 101. As for the laser beam supply unit 102, a YAG laser beam supply unit or other laser beam supply unit can be adopted. However, it is desired to use one that can control an irradiation energy amount, irradiation timing, an irradiation frequency and a focal length. In stead of the single laser beam supply unit in which the irradiation energy of the laser beam is variably controlled, a plurality of laser beam supply units including a first supply unit for irradiating a laser beam with a high energy that can melt the solder ball and a second supply unit for irradiating a laser beam with a low energy that will clean solder connection junctions.

The control unit 103 controls a supply timing of the solder ball at each solder ball supply unit 101, and controls an irradiation energy amount (output level and duration), an irradiation timing, an irradiation frequency and a focal length of each laser beam supply unit 102.

FIGS. 11 to 14 illustrate parts of the manufacturing method using the manufacturing apparatus of FIG. 10. Hereinafter, an embodiment of the manufacturing method will be described with reference to these figures that show only the minimum parts required for explaining the processes.

Figure 11:
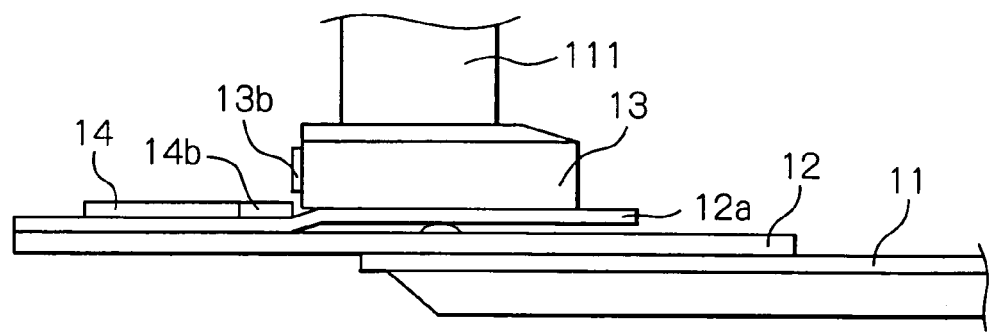
FIG. 11 is a side view illustrating a part of a manufacturing method using the manufacturing apparatus shown in FIG. 10.

First, as shown in FIG. 11, the magnetic head slider 13 is placed at a predetermined position on the suspension 10, namely at a predetermined position on the tongue 12a of the flexure 12, by using a jig 111.

Figure 12:
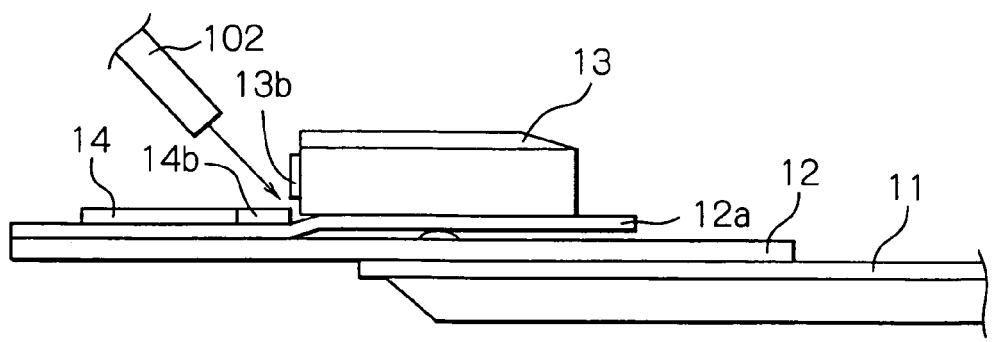
FIG. 12 is a side view illustrating a part of the manufacturing method using the manufacturing apparatus shown in FIG. 10.

Then, as shown in FIG. 12, in response to instructions from the control unit 103, a laser beam with a relatively low energy is irradiated from the laser beam supply unit 102 to the four terminal pads 13b of the magnetic head slider 13 and to the four connection pads 14b of the lead conductor member 14 (to four pairs of pads) so as to perform a preheating process for securing solder wettability. In this embodiment, a single laser beam from the laser beam supply unit 102 covers the four pairs of pads, that is the four terminal pads 13b and the four connection pads 14b so that the preheating is performed by one irradiation of the laser beam. In this case, an irradiation area of the laser beam should be determined to the minimum area required to cover the four terminal pads 13b and the four connection pads 14b in consideration of the thermal influence on the slider body 13a.

When preheating, each pair of pads may be independently irradiated by scanning a single laser beam or a plurality of pairs of pads may be simultaneously irradiated by the respective laser beams instead of one irradiation of the large laser beam.

Figure 13:
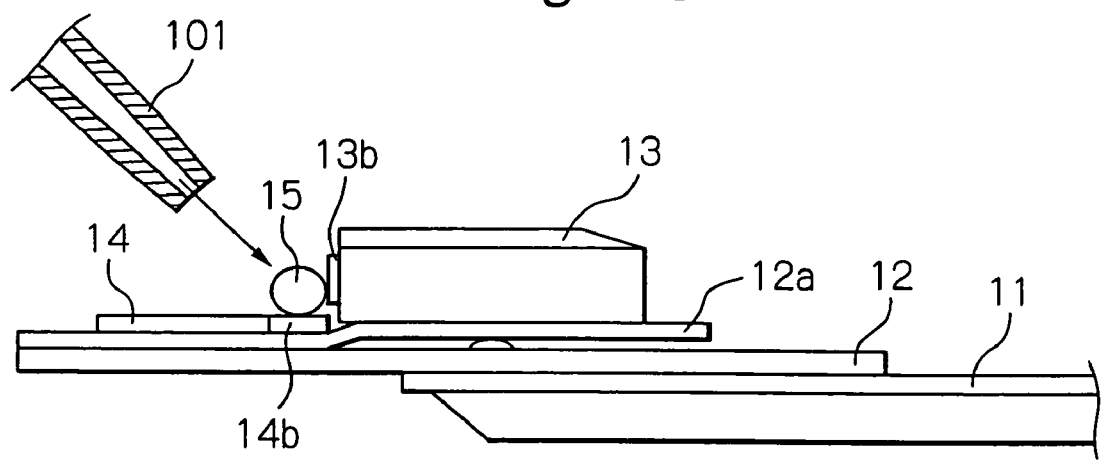
FIG. 13 is a side view illustrating a part of the manufacturing method using the manufacturing apparatus shown in FIG. 10.

Then, as shown in FIG. 13, in response to instructions from the control unit 103, solder balls with cores 15 are supplied onto four pairs of pads that consist of the four terminal pads 13b of the magnetic head slider 13 and to the four connection pads 14b of the lead conductor member 14 from the solder ball supply unit 101 at predetermined timing.

Figure 14:
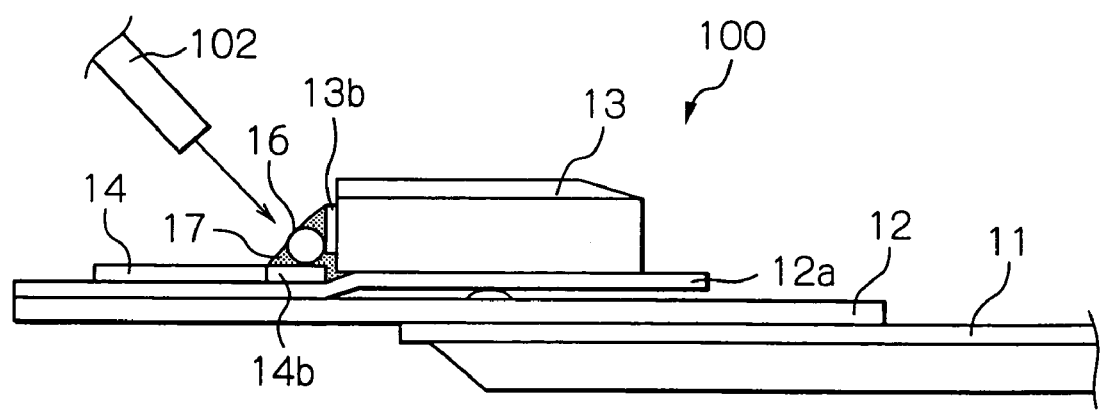
FIG. 14 is a side view illustrating a part of the manufacturing method using the manufacturing apparatus shown in FIG. 10.

Thereafter, as shown in FIG. 14, a laser beam with enough energy for melting the solder is irradiated from the laser beam supply unit 102 to the solder balls with cores 15 so as to perform a heating process. Thus, at this heating process, the four terminal pads 13b and the four connection pads 14b are electrically and mechanically connected with each other by the reflowed solder 17 and therefore the magnetic head slider 13 is fixed on the suspension 10 to complete the HGA 100.

In this embodiment, a single laser beam from the laser beam supply unit 102 covers the four pairs of pads, that is the four terminal pads 13b and the four connection pads 14b so that the heating process is performed by one irradiation of the laser beam. For the heating process, however, each pair of pads may be independently irradiated by scanning a single laser beam or a plurality of pairs of pads may be simultaneously irradiated by the respective laser beams instead of one irradiation of the large laser beam.

Figure 15:
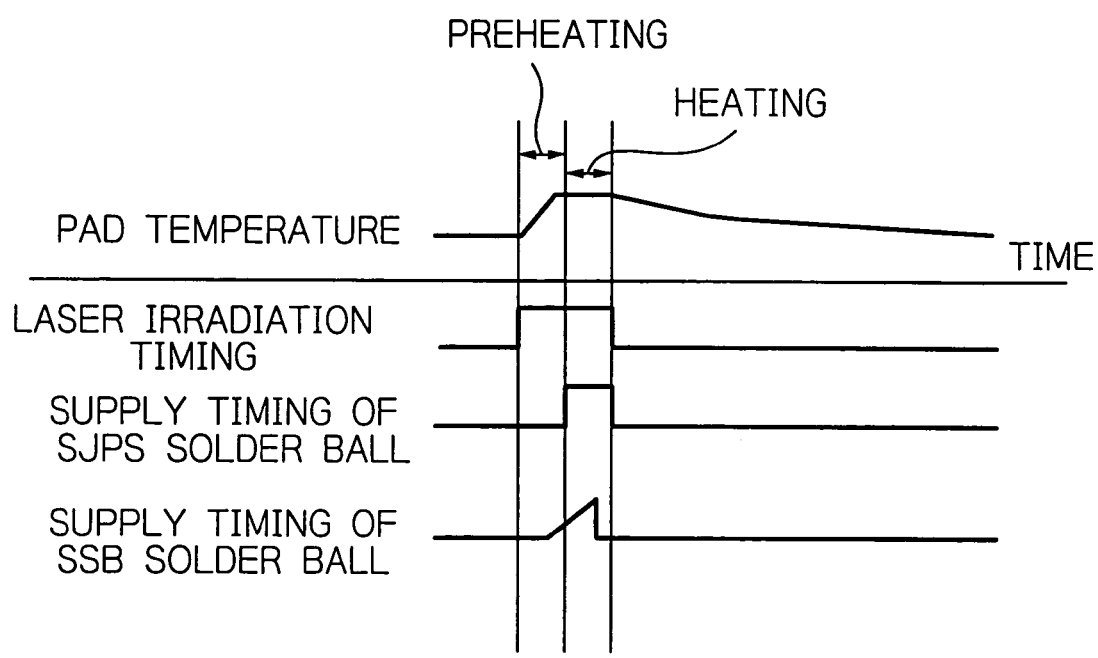
FIG. 15 is a timing chart illustrating timings of stages from a preheating to a solder ball supply.

FIG. 15 illustrates timings of processes from a preheating to a solder ball supply. Hereinafter, the timings of the preheating to the solder ball supply controlled by the control unit 103 are described with reference to this figure.

First, the preheating process is executed by irradiating the laser beam to the pairs of pads so that the temperature of the magnetic head element rises to an adequate temperature. This adequate temperature is determined to 150° C. or less in order to give no thermal damage to the magnetic head element and the slider body 13a, but to a temperature capable of securing solder wettability for the pads. A time period of the preheating process varies depending upon irradiation energy and a frequency of the laser beam.

After the preheating process is started, a solder ball is supplied at timing when the temperature will reach the adequate temperature. This supply timing of the solder ball differs depending upon kinds of the solder ball supply unit 101. As shown in FIG. 15, in a supply unit with a relatively quick response time for solder ball supplying such as for example SJPS, the solder ball supply will start after the temperature rises to the adequate temperature. Whereas, in a solder ball unit with a relatively slow response time for solder ball supplying such as for example SSB, the solder ball supply will start before the temperature rises to the adequate temperature in consideration of the time lag.

The laser beam supply unit 102 is controlled by the control unit 103 to supply the laser beam with controlled irradiation energy so that the process sequentially shifts from the preheating process to the heating process. In modifications, laser beams with different irradiation energies may be used for the preheating process and the heating process, respectively, or laser beams with the same irradiation energy may be used with different irradiation time periods for the preheating process and the heating process. During the preheating process, the irradiation energy of the laser beam may be stepwise changed with the lapse of time. For example, the irradiation energy may be changed from a low level for cleaning the pad surfaces to a high level for raising the pad temperature.

According to the above-mentioned manufacturing method, since the preheating is executed, solder wettability of the terminal pads of the magnetic head slider and the connection pads of the lead conductor member can be secured without suffering thermal shape change or thermal damage to the slider body. Therefore, it is possible to improve reliability of electrical connections between these terminal pads and the lead connection pads. If the solder reflow is repeated after the aforementioned manufacturing method, the reliability can be further improved.

In case that the solder balls are supplied by injection as done in SJPS, since reliability of electrical connections will reduced if the pads are not warmed, the above-mentioned manufacturing method with the preheating process is particularly effective.

Such preheating of the connection pads may be adopted in not only the manufacturing method of the HGA in which the magnetic head slider is fixed to the suspension only by the solder connections but also a manufacturing method of another type HGA including an HGA in which a magnetic head slider is fixed to a suspension by both solder connections and adhesive connections.

In general, after the terminal pads 13b of the magnetic head slider 13 and the connection pads 14b of the lead conductor member 14 are electrically connected with each other by reflowing the solder balls with cores 15 at the heating process, characteristics test of the magnetic write head element and/or the magnetic read head element of the magnetic head slider is executed. If it is judged as malfunctions at the characteristics test, a rework is done to detach the malfunctioned magnetic head slider 13 from the flexure 12 and new magnetic head slider is attached to the reused suspension. The rework when the connections are in the reflowed state after solder reflowing is in general performed by re-melting the solder under the reflowed state so that the magnetic head slider 13 is detachable from the flexure 12 of the suspension 10. In this reworking process, since the solder balls with cores in which a balance of each core and each solder layer is appropriately determined are used, shape of each solder connection is kept in the core shape even if it is in the reflowed state. Thus, extremely easy rework process can be expected. Particularly, when a solder removing method of re-melting the solder by the laser beam heating and sucking the molten solder by a vacuum nozzle is used, the molten solder can be removed by sucking the core to which the molten solder is attached. As a result, a stable amount of solder can be removed and damage applied to the reusing suspension can be reduced. Also, the solder surface on the connection pad can become easily flattened.

Characteristics test of the magnetic write head element and/or the magnetic read head element of the magnetic head slider may be executed during the pre-reflowed state in which the solder layers of the solder balls with cores 15 are not fully molten but partially molten by irradiation of a low energy laser beam to provide tentative solder connections. In this case, using of the solder balls with cores presents stably kept shape and area for each solder ball to ease their control, and therefore, when the HGA is reworked under this pre-reflowed state, detachment of the malfunctioned magnetic head slider from the suspension becomes greatly easier. In this case, also, since the molten solder can be removed by sucking the core to which the molten solder is attached, a stable amount of solder can be removed and damage applied to the reusing suspension can be reduced. Also, the solder surface on the connection pad can become easily flattened. If the magnetic write head element and/or the magnetic read head element of the magnetic head slider is judged as good at the characteristics test, the HGA will not be reworked but will be reflowed to melt the solder balls and to make solder connections.

Figure 16:
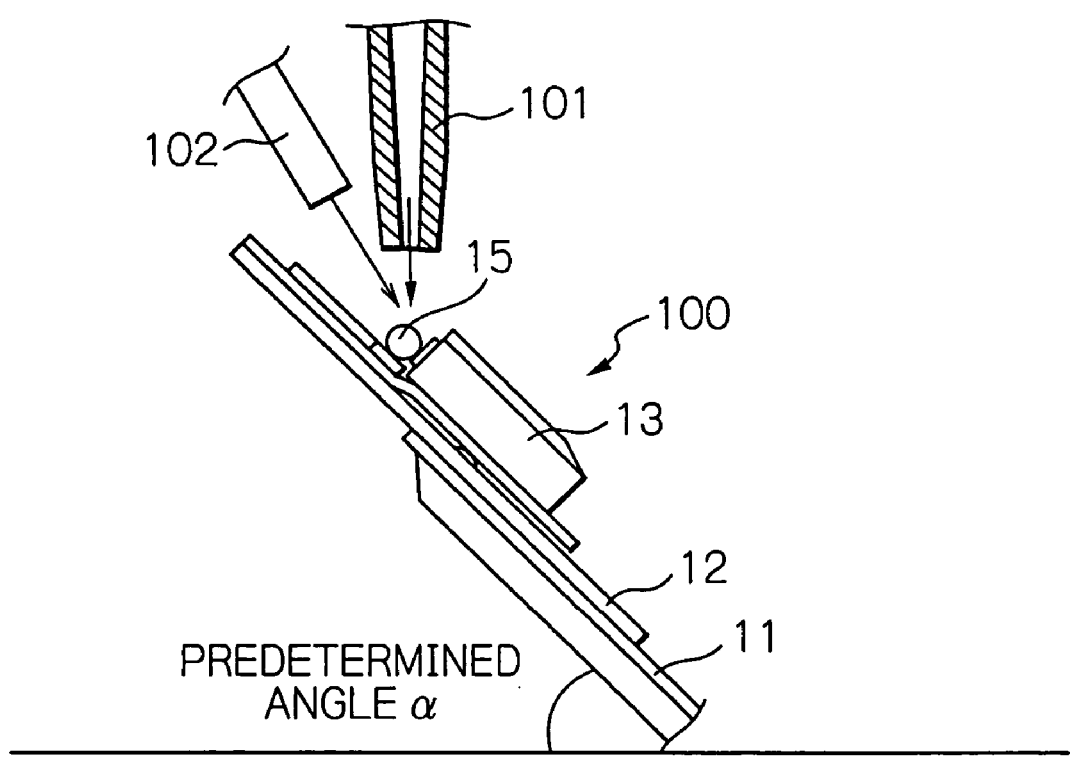
FIG. 16 is a side view illustrating a process of supplying a solder ball to a tilted HGA as a modification of the manufacturing method of FIGS. 11 to 14.

In modification of the above-mentioned manufacturing method, a solder ball 15 may be supplied as shown in FIG. 16 while keeping the HGA 100 tilted by a predetermined angle α such as 45 degrees with respect to the horizontal direction. This modification will reduce a deviation in the supplied position of the solder ball 15.

Figure 17:
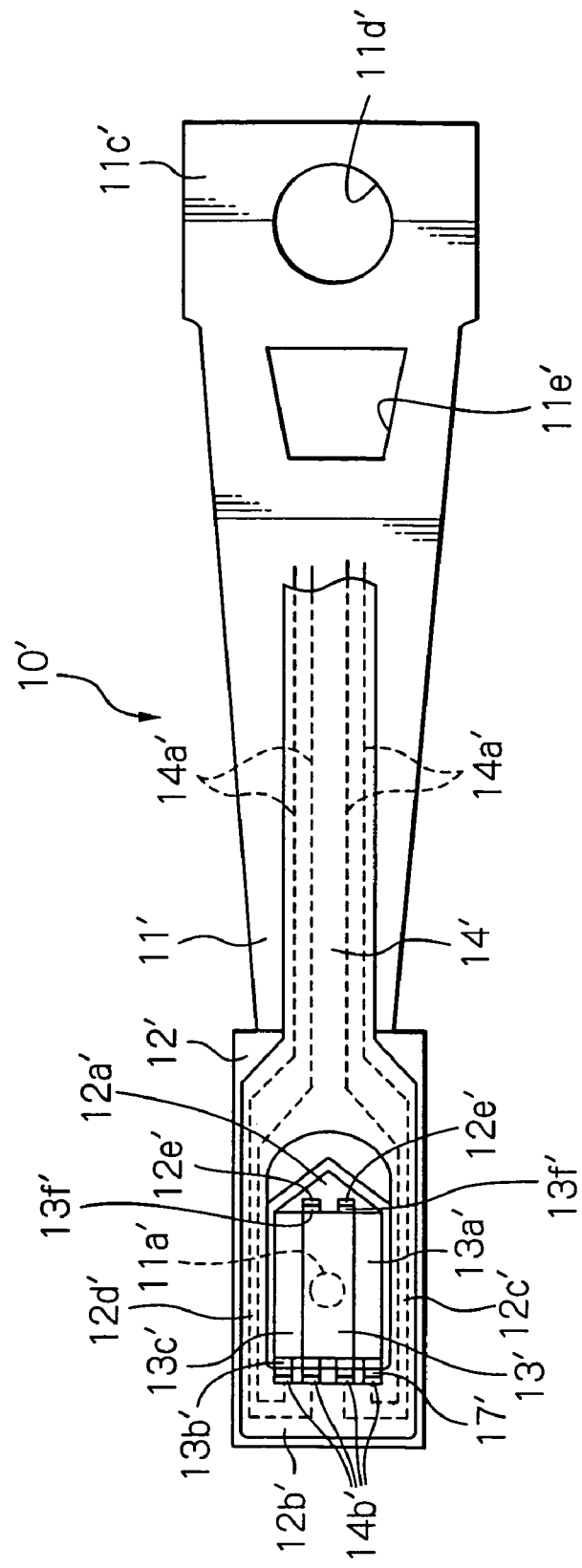
FIG. 17 is a plane view of an HGA seen from a slider-mounting side as another embodiment of a magnetic head device according to the present invention.
Figure 18:
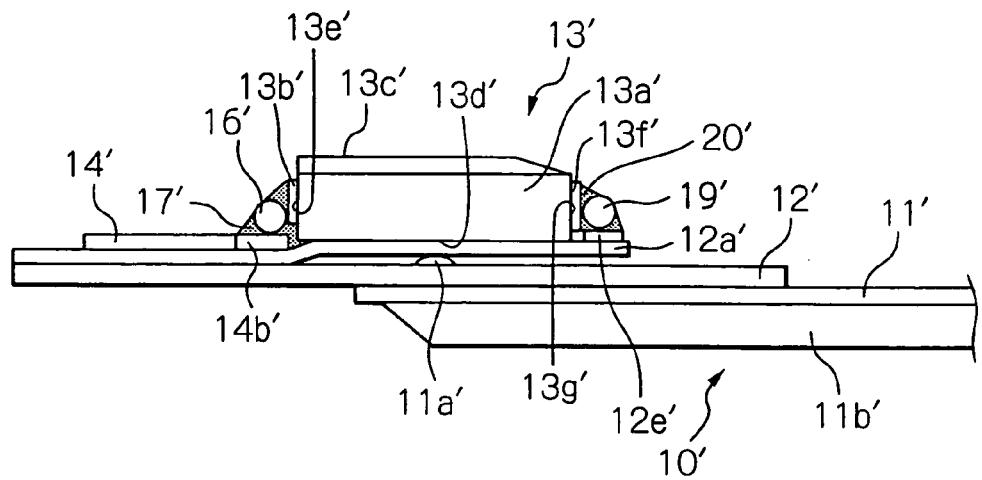
FIG. 18 is an enlarged side view of a top end section of the HGA shown in FIG. 17.

FIG. 17 illustrates an HGA seen from a slider-mounting side as another embodiment of a magnetic head device according to the present invention, and FIG. 18 illustrates an enlarged top end section of the HGA shown in FIG. 17.

As shown in these figures, the HGA has a suspension 10' mainly constituted by a load beam 11' with a relatively high stiffness and a resilient flexure 12', a magnetic head slider 13' fixed on the suspension 10', and a lead conductor member 14' formed on or fixed to the suspension 10'.

The load beam 11' has a protrusion or dimple 11a' for applying a load to the magnetic head slider 13'. This dimple 11a' is positioned on the longitudinal center axis line near a free end section or top end section of the load beam 11'. As shown in FIG. 18, the load beam 11' also has bent sections or ribs 11b' at both side edges for increasing stiffness of the corresponding section of the load beam 11'. The load beam 11' further has at its rear end section an attachment section 11c' with an attachment via hole 11d' used for fixing the load beam 11' to a support arm, and a via hole 11e', formed near the attachment via hole 11d', for reducing the whole weight of the load beam 11'.

The flexure 12' is formed by a thin spring plate. One surface (first surface) of the flexure 12' is attached by swaging to a surface of the load beam 11', from which surface the protrusion 11a' juts to receive a pressed load from the protrusion 11a'. The magnetic head slider 13' is attached to the other surface (second surface) of the flexure 12'. Instead of swaging, the flexure 12' may be attached by spot welding to the first surface of the load beam 11'.

The flexure 12' has at its center a tongue 12a'. Only one end of the tongue 12a' is integrally coupled with a lateral frame 12b' located at a top end of the flexure 12', and the other end of the tongue 12a' is free end. Both ends of the lateral frame 12b' are integrally coupled with outer frames 12c' and 12d' of the flexure 12', respectively. Side ends of the tongue 12a' are separated from the outer frames 12c' and 12d', and the other end of the tongue 12a' is also separated from the flexure 12'. Top end of the protrusion 11a' of the load beam 11' abuts on one surface (first surface) of the tongue 12a'. On the other surface (second surface) of the tongue 12a' of the flexure 12', a plurality of (two in this case) dummy pads 12e' are formed. The magnetic head slider 13' is mechanically fixed to the flexure 12' by solder ball connection, that is, the connection using solder balls with cores between the dummy pads 12e' and dummy terminal pads 13f' of the magnetic head slider 13'. The dummy pads 12e' are directly formed on the tongue 12a' of the flexure 12' and thus grounded. These dummy pads 12e' are solder-connected with the dummy terminal pads 13f' of the magnetic head slider 13'. Thus, the dummy terminal pads 13f' are grounded. If the dummy pads 12e' are formed on the lead conductor member, by grounding these dummy pads 12e', the dummy terminal pads 13f' of the magnetic head slider 13' are grounded.

The magnetic head slider 13' has a slider body 13a', a magnetic write head element of an inductive element in this embodiment, a magnetic read head element of a GMR element in this embodiment, a plurality of (four in this case) terminal pads or bumps 13b' electrically connected to these magnetic write and read head elements, and a plurality of (two in this case) the dummy terminal pads 13f'.

One surface 13d' of the slider body 13a', which is opposite to its ABS 13c', is attached to the other surface (second surface) of the tongue 12a' of the flexure 12'. On an element formed surface 13e' of the slider body 13a', the terminal pads 13b' are formed. The dummy terminal pads 13f' are formed on another surface 13g' of the slider body 13a', opposite to the element formed surface 13e'.

The lead conductor member 14' is supported by the flexure 12' and the load beam 11' of the suspension 10' and has a plurality of (four in this case) trace conductors 14a', and a plurality of (four in this case) connection pads or lead pads 14b'. The trace conductors 14a' are embedded in a flexible insulation support layer and one ends of the trace conductors 14a' are connected to the respective connection pads 14b'. These connection pads 14b' are formed on the flexure 12' at locations corresponding to these of the terminal pads 13b' of the magnetic head slider 13', respectively. Typical example of such lead conductor member 14' is a so-called tub tape.

The terminal pads 13b' of the magnetic head slider 13' and the connection pads 14b' of the lead conductor member 14' are connected with each other by reflowed solders 17', respectively. Each reflowed solder 17' is formed by laser reflowing of a solder ball 15' supplied at a corner between the second surface of the flexure 12' and the element formed surface 13e' of the slider body 13a'. The dummy terminal pads 13f' of the magnetic head slider 13' and the dummy pads 12e' formed on the tongue 12a' of the flexure 12' are connected with each other by reflowed solders 20', respectively. Each reflowed solder 20' is formed by laser reflowing of a solder ball 18' supplied at a corner between the second surface of the flexure 12' and the surface 13g' opposite to the element formed surface 13e' of the slider body 13a'. By these solder connections only, the magnetic head slider 13' is fixed to the tongue 12a' of the flexure 12'. No adhesive is used. By means of the solder connection between the terminal pads 13b' of the magnetic head slider 13' and the connection pads 14b' of the lead conductor member 14', the magnetic write head element and the magnetic read head element of the magnetic head slider 13' are electrically connected with the trace conductors 14a' of the lead conductor member 14'.

In this embodiment, also, solder balls with sphere cores 16' and 19' inside, which will not melt even at a solder-melting temperature, are used as the solder balls 15' and 18', respectively. Structure, dimension and material of these solder balls with cores are the same as these already described in relation to FIGS. 4a and 4b.

Figure 19A:
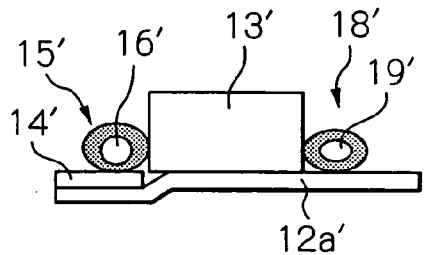
FIGS. 19a and 19b are sectional views illustrating electrical and mechanical connection configurations between a terminal pad of a magnetic head slider and a connection pad of a lead conductor member using the solder ball with core, in the embodiment of FIG. 17.
Figure 19B:
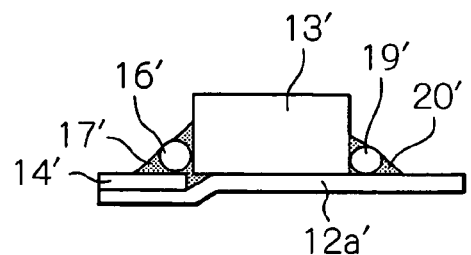

FIGS. 19a and 19b illustrate electrical and mechanical connection configurations between the terminal pad and the dummy terminal pad of the magnetic head slider, and the connection pad of the lead conductor member and the dummy pad using such solder ball with a core.

FIG. 19a shows a pre-bump or pre-reflowed state before full solder reflowing. This pre-reflowed state is attained by placing solder balls 15' and 18' with cores 16' and 19' inside between the terminal pads of the magnetic head slider 13' and the connection pads of the lead conductor member 14' and between the dummy terminal pads of the magnetic head slider 13' and the dummy pads formed on the tongue 12a' of the flexure 12' so that the solder balls abut to the surfaces of the terminal pads and the connection pads and the surfaces of the dummy terminal pads and the dummy pads, and then by partially melting the solder layers of the solder balls to provide tentative solder connections as a result of irradiation of a low energy laser beam. FIG. 19b on the other hands shows a bump or reflowed state with fully reflowed solders 17' and 20'. This reflowed state is attained by reflowing the solder balls 15' and 18' placed between the terminal pads of the magnetic head slider 13' and the connection pads of the lead conductor member 14' and between the dummy terminal pads of the magnetic head slider 13' and the dummy pads formed on the tongue 12a' of the flexure 12' by irradiating a laser beam so as to fully melt the solder layers of the solder balls 15' and 18'.

Since the solder balls with cores, which are stable in shape are used, variations in roll angle and pitch angle of the magnetic head slider occurring during the solder connection can be reduced and stabilized. Thus, flying performance of the magnetic head slider and therefore its output characteristics can be stably kept.

Using of the solder balls with cores presents easy rework of the HGA even if the connections between the magnetic head slider and the suspension are in the reflowed state after solder reflowing. When a magnetic write head element and/or a magnetic read head element of a magnetic head slider is judged as malfunction at the characteristics test, the rework is done to exchange the malfunctioned magnetic head slider to a new magnetic head slider while reusing the suspension. The rework when the connections are in the reflowed state after solder reflowing is in general performed by re-melting the solder under the reflowed state so that the magnetic head slider 13' is detachable from the flexure 12' of the suspension 10'. In this reworking process, since the solder balls with cores in which a balance of each core and each solder layer is appropriately determined are used, shape of each solder connection is kept in the core shape even if it is in the reflowed state. Thus, extremely easy rework process can be expected.

Also, since the solder balls are placed at corners between the second surface of the tongue 12a' of the flexure 12' and the element formed surface 13e' of the slider body 13a' and at corners between the second surface of the tongue 12a' of the flexure 12' and the surface 13g' opposite to the element formed surface 13e' of the slider body 13a', heat such as laser beam heat applied from outside can be concentrated to the solder balls. Thus, during the solder reflow process for solder connections or detachment of the magnetic head slider 13', possible thermal damage to the GMR element on the magnetic head slider 13' can be minimized.

If the magnetic head slider 13' is fixed to the suspension 10' only by the solder connections without using resin adhesive, it is possible to prevent shape change in the magnetic head slider due to the difference in thermal expansion coefficients between the resin adhesive and the magnetic head slider, and thus to prevent deterioration in the flying performance of the slider.

Furthermore, using of the solder balls with cores presents stably kept shape and area for each solder ball to ease their control even if the connections are in pre-reflowed state before solder reflowing. Therefore, when the HGA is reworked under this pre-reflowed state, detachment of the malfunctioned magnetic head slider from the suspension becomes greatly easier. If the magnetic write head element and/or the magnetic read head element of the magnetic head slider is judged as good at the characteristics test, the HGA will not be reworked but will be reflowed to melt the solder balls and to make solder connections.

An HAA with a support arm and the above-mentioned HGA attached to the support arm, and an HSA with a plurality of stacked HAAs can be similarly adopted as these described in reference to the former embodiment (FIGS. 6–8).

Hereinafter, manufacturing processes of the HGA of this embodiment according to the present invention will be described.

Figure 20:
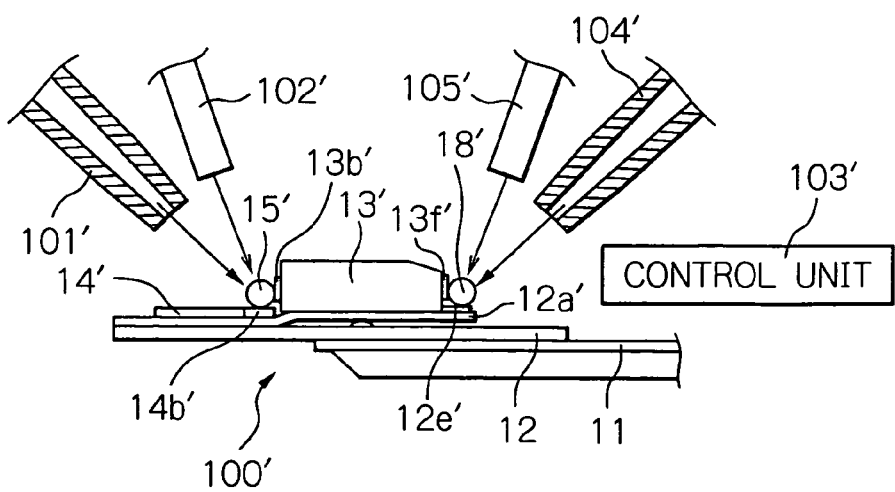
FIG. 20 is a side view illustrating schematic structure of a manufacturing apparatus used for fabricating the HGA of the embodiment of FIG. 17.

FIG. 20 illustrates schematic structure of a manufacturing apparatus used for fabricating the HGA of this embodiment.

As shown in the figure, the manufacturing apparatus of an HGA 100' is provided with solder ball supply units or connection ball supply units 101' and 104', laser beam supply units 102' and 105' and a control unit 103' for controlling these units 101', 102', 104' and 105'.

The HGA 100' itself has the structure as shown in FIGS. 17 and 18. The present invention can be adopted in the HGA itself, the HAA similar to that shown in FIGS. 6 and 7, the HSA similar to that shown in FIGS. 8 and 9, and a magnetic disk drive apparatus with the HAA or HSA.

The solder ball supply unit 101' supplies solder balls 15' to junctions between the terminal pads 13b' of the magnetic head slider 13' and the connection pads 14b' of the lead conductor member 14', respectively. The solder ball supply unit 104' supplies solder balls 18' to junctions between the dummy terminal pads 13f' of the magnetic head slider 13' and the dummy pads 12e' formed on the tongue 12a' of the flexure 12', respectively. Each of these units 101' and 104' may be for example a Solder Ball Bumper (SBB) of Pac Tech GmbH, or a Solder Jet Printer System (SJPS) of MicroFab Technologies, Inc. As mentioned before, the SBB places the solder balls on the junctions, whereas the SJPS injects molten solder balls to the junctions.

The laser beam supply unit 102' irradiates a focused laser beam to each of the junctions between the terminal pads 13b' of the magnetic head slider 13' and the connection pads 14b' of the lead conductor member 14', and to the solder balls 15' supplied to the junctions by the solder ball supply unit 101'. The laser beam supply unit 105' irradiates a focused laser beam to each of the junctions between the dummy terminal pads 13f' of the magnetic head slider 13' and the dummy pads 12e' formed on the tongue 12a' of the flexure 12', and to the solder balls 18' supplied to the junctions by the solder ball supply unit 104'. As for each of the laser beam supply units 102' and 104', a YAG laser beam supply unit or other laser beam supply unit can be adopted. However, it is desired to use one that can control an irradiation energy amount, irradiation timing, an irradiation frequency and a focal length.

In stead of the single laser beam supply unit for each in which the irradiation energy of the laser beam is variably controlled, a plurality of laser beam supply units including a first supply unit for irradiating a laser beam with a high energy that can melt the solder ball and a second supply unit for irradiating a laser beam with a low energy that will clean solder connection junctions.

The control unit 103' controls a supply timing of the solder ball at each of the solder ball supply units 101' and 104', and controls an irradiation energy amount (output level and duration), an irradiation timing, an irradiation frequency and a focal length of each of the laser beam supply units 102' and 105'.

FIGS. 21 to 24 illustrate parts of the manufacturing method using the manufacturing apparatus of FIG. 20. Hereinafter, an embodiment of the manufacturing method will be described with reference to these figures that show only the minimum parts required for explaining the processes.

Figure 21:
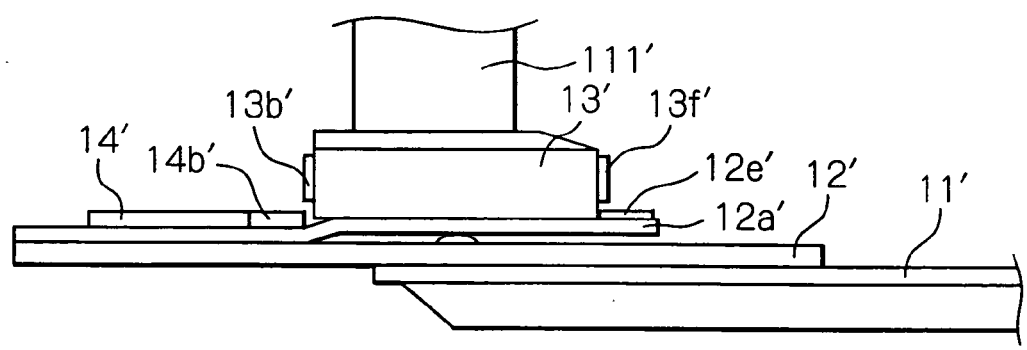
FIG. 21 is a side view illustrating a part of a manufacturing method using the manufacturing apparatus shown in FIG. 20.

First, as shown in FIG. 21, the magnetic head slider 13' is placed at a predetermined position on the suspension 10', namely at a predetermined position on the tongue 12a' of the flexure 12', by using a jig 111'.

Figure 22:
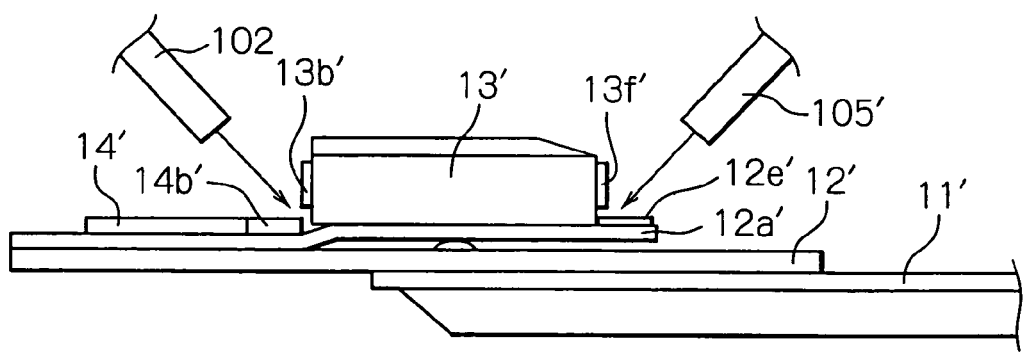
FIG. 22 is a side view illustrating a part of the manufacturing method using the manufacturing apparatus shown in FIG. 20.

Then, as shown in FIG. 22, in response to instructions from the control unit 103', a laser beam with a relatively low energy is irradiated from the laser beam supply unit 102' to the four terminal pads 13b' of the magnetic head slider 13' and to the four connection pads 14b' of the lead conductor member 14' (to four pairs of pads) so as to perform a preheating process for securing solder wettability. In this embodiment, a single laser beam from the laser beam supply unit 102' covers the four pairs of pads, that is the four terminal pads 13b' and the four connection pads 14b' so that the preheating process is performed by one irradiation of the laser beam. In this case, an irradiation area of the laser beam should be determined to the minimum area required to cover the four terminal pads 13b' and the four connection pads 14b' in consideration of the thermal influence on the slider body 13a'.

Similarly, a laser beam with a relatively low energy is irradiated from the laser beam supply unit 105' to the two dummy terminal pads 13f' and the two dummy pads 12e' (to two pairs of pads) so as to perform a preheating process for securing solder wettability. In this embodiment, a single laser beam from the laser beam supply unit 105' covers the two pairs of pads, that is the two dummy terminal pads 13f' and the two dummy pads 12e' so that the preheating process is performed by one irradiation of the laser beam. In this case, an irradiation area of the laser beam should be determined to the minimum area required to cover the two dummy terminal pads 13f' and the two dummy pads 12e' in consideration of the thermal influence on the slider body 13a'.

The preheating of the four terminal pads 13b' and the four connection pads 14b' and the preheating of the two dummy terminal pads 13f' and the two dummy pads 12e' may be simultaneously executed by the respective laser beam supply units 102' and 105'. These preheating can be separately executed by the single laser beam supply unit 102' or 105'. When preheating, each pair of pads may be independently irradiated by scanning a single laser beam or a plurality of pairs of pads may be simultaneously irradiated by the respective laser beams instead of one irradiation of the large laser beam.

Figure 23:
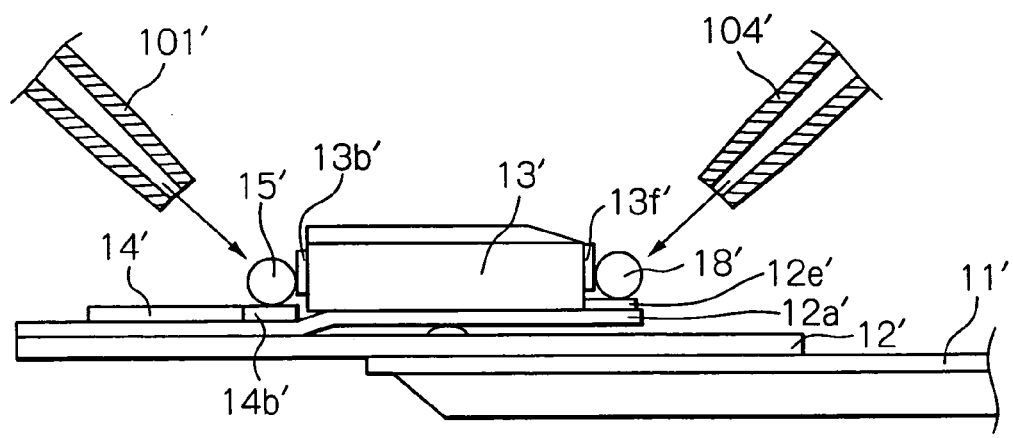
FIG. 23 is a side view illustrating a part of the manufacturing method using the manufacturing apparatus shown in FIG. 20.

Then, as shown in FIG. 23, in response to instructions from the control unit 103', solder balls with cores 15' and 18' are supplied onto four pairs of pads that consist of the four terminal pads 13b' and the four connection pads 14b' and onto two pairs of pads that consist of the two dummy terminal pads 13f' and the two dummy pads 12e' from the solder ball supply units 101' and 104', respectively, at predetermined timing.

Figure 24:
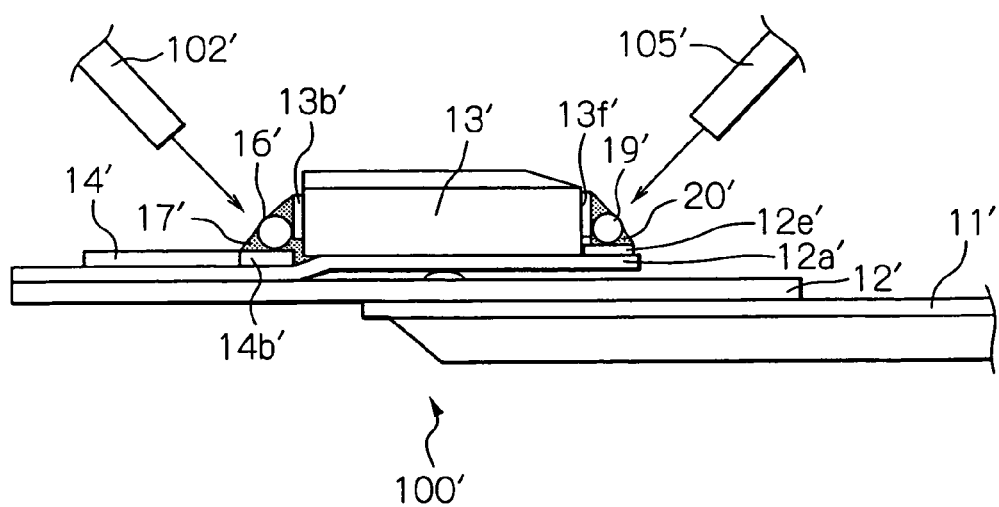
FIG. 24 is a side view illustrating a part of the manufacturing method using the manufacturing apparatus shown in FIG. 20.

Thereafter, as shown in FIG. 24, laser beams with an enough energy for melting the solder is irradiated from the laser beam supply units 102' and 105' to the respective solder balls with cores 15' and 18' so as to perform a heating process. Thus, at this heating process, the four terminal pads 13b' and the four connection pads 14b' are electrically and mechanically connected with each other by the reflowed solder 17', and the two dummy terminal pads 13f' and the two dummy pads 12e' are mechanically connected with each other by the reflowed solder 20'. Therefore, the magnetic head slider 13' is fixed on the suspension 10' to complete the HGA 100'.

In this embodiment, a single laser beam from the laser beam supply unit 102' covers the four pairs of pads, that is the four terminal pads 13b' and the four connection pads 14b' so that the heating is performed by one irradiation of the laser beam. Also, a single laser beam from the laser beam supply unit 105' covers the two pairs of pads, that is the two dummy terminal pads 13f' and the two dummy pads 12e' so that the heating is performed by one irradiation of the laser beam.

For the heating process, however, each pair of pads may be independently irradiated by scanning a single laser beam or a plurality of pairs of pads may be simultaneously irradiated by the respective laser beams instead of one irradiation of the large laser beam.

Timings of processes from a preheating to a solder ball supply controlled by the control unit 103' are the same as that described with reference to FIG. 15 in the embodiment of FIG. 1.

The laser beam supply units 102' and 105' are controlled by the control unit 103' to supply the laser beams with controlled irradiation energies so that each process sequentially shifts from the preheating process to the heating process. In modifications, laser beams with different irradiation energies may be used for the preheating process and the heating process, respectively, or laser beams with the same irradiation energy may be used with different irradiation time periods for the preheating process and the heating process, respectively. During the preheating, the irradiation energy of each laser beam may be stepwise changed with the lapse of time. For example, the irradiation energy may be changed from a low level for cleaning the pad surfaces to a high level for raising the pad temperature.

According to the above-mentioned manufacturing method, since the preheating is executed, solder wettability of the terminal pads and the dummy terminal pads of the magnetic head slider, the connection pads of the lead conductor member and the dummy pads can be secured without suffering thermal shape change or thermal damage to the slider body. Therefore, it is possible to improve reliability of electrical connections between the terminal pads and the lead connection pads and reliability of mechanical connections between the dummy terminal pads and the dummy pads. If the solder reflow is repeated after the aforementioned manufacturing method, the reliability can be further improved.

In case that the solder balls are supplied by injection as done in SJPS, since reliability of electrical connections will reduced if the pads are not warmed, the above-mentioned manufacturing method with the preheating process is particularly effective.

Such preheating of the pads may be adopted in not only the manufacturing method of the HGA in which the magnetic head slider is fixed to the suspension only by the solder connections but also a manufacturing method of another type HGA including an HGA in which a magnetic head slider is fixed to a suspension by both solder connections and adhesive connections.

In general, after the terminal pads 13b' and the dummy terminal pads 13f' of the magnetic head slider 13' and the connection pads 14b' of the lead conductor member 14' and the dummy pads 12e' are electrically connected with each other by reflowing the solder balls with cores 15' and 18' at the heating process, characteristics test of the magnetic write head element and/or the magnetic read head element of the magnetic head slider 13' is executed. If it is judged as malfunctions at the characteristics test, a rework is done to detach the malfunctioned magnetic head slider 13' from the flexure 12' and new magnetic head slider is attached to the reused suspension. The rework when the connections are in the reflowed state after solder reflowing is in general performed by re-melting the solder under the reflowed state so that the magnetic head slider 13' is detachable from the flexure 12' of the suspension 10'. In this reworking process, since the solder balls with cores in which a balance of each core and each solder layer is appropriately determined are used, shape of each solder connection is kept in the core shape even if it is in the reflowed state. Thus, extremely easy rework process can be expected. Particularly, when a solder removing method of re-melting the solder by the laser beam heating and sucking the molten solder by a vacuum nozzle is used, the molten solder can be removed by sucking the core to which the molten solder is attached. As a result, a stable amount of solder can be removed and damage applied to the reusing suspension can be reduced. Also, the solder surface on the connection pad can become easily flattened.

Characteristics test of the magnetic write head element and/or the magnetic read head element of the magnetic head slider may be executed during the pre-reflowed state in which the solder layers of the solder balls with cores 15' and 18' are not fully molten but partially molten by irradiation of low energy laser beams to provide tentative solder connections. In this case, using of the solder balls with cores presents stably kept shape and area for each solder ball to ease their control, and therefore, when the HGA is reworked under this pre-reflowed state, detachment of the malfunctioned magnetic head slider from the suspension becomes greatly easier. In this case, also, since the molten solder can be removed by sucking the core to which the molten solder is attached, a stable amount of solder can be removed and damage applied to the reusing suspension can be reduced. Also, the solder surface on the connection pad can become easily flattened. If the magnetic write head element and/or the magnetic read head element of the magnetic head slider is judged as good at the characteristics test, the HGA will not be reworked but will be reflowed to melt the solder balls and to make solder connections.

Figure 25:
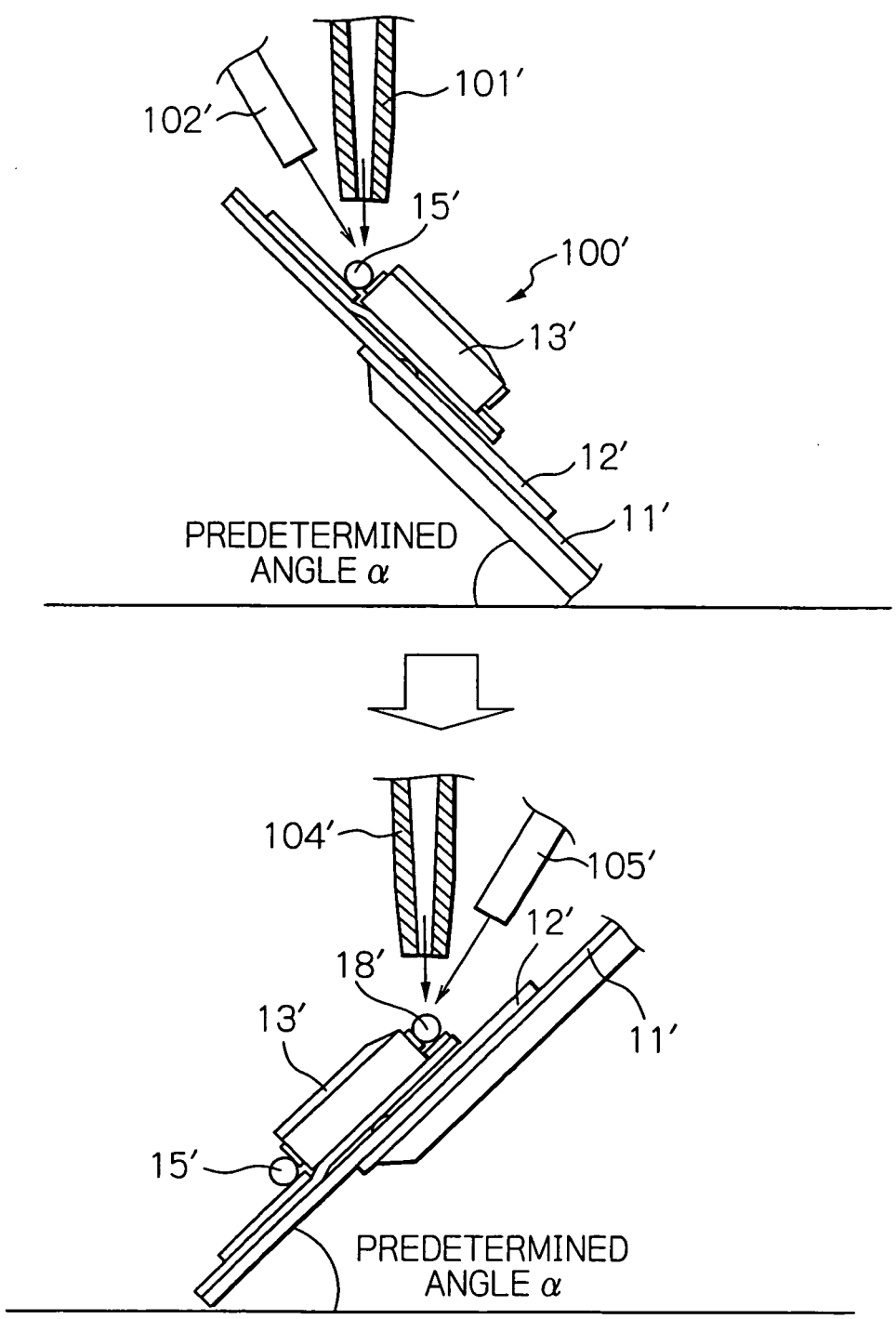
FIG. 25 is a side view illustrating a process of supplying a solder ball to a tilted HGA as a modification of the manufacturing method of FIGS. 21 to 24.

In modification of the above-mentioned manufacturing method, solder balls 15' and 18' may be supplied as shown in FIG. 25 while keeping the HGA 100' tilted by a predetermined angle α such as 45 degrees with respect to the horizontal direction. This modification will reduce a deviation in the supplied positions of the solder balls 15' and 18'.

Figure 26:
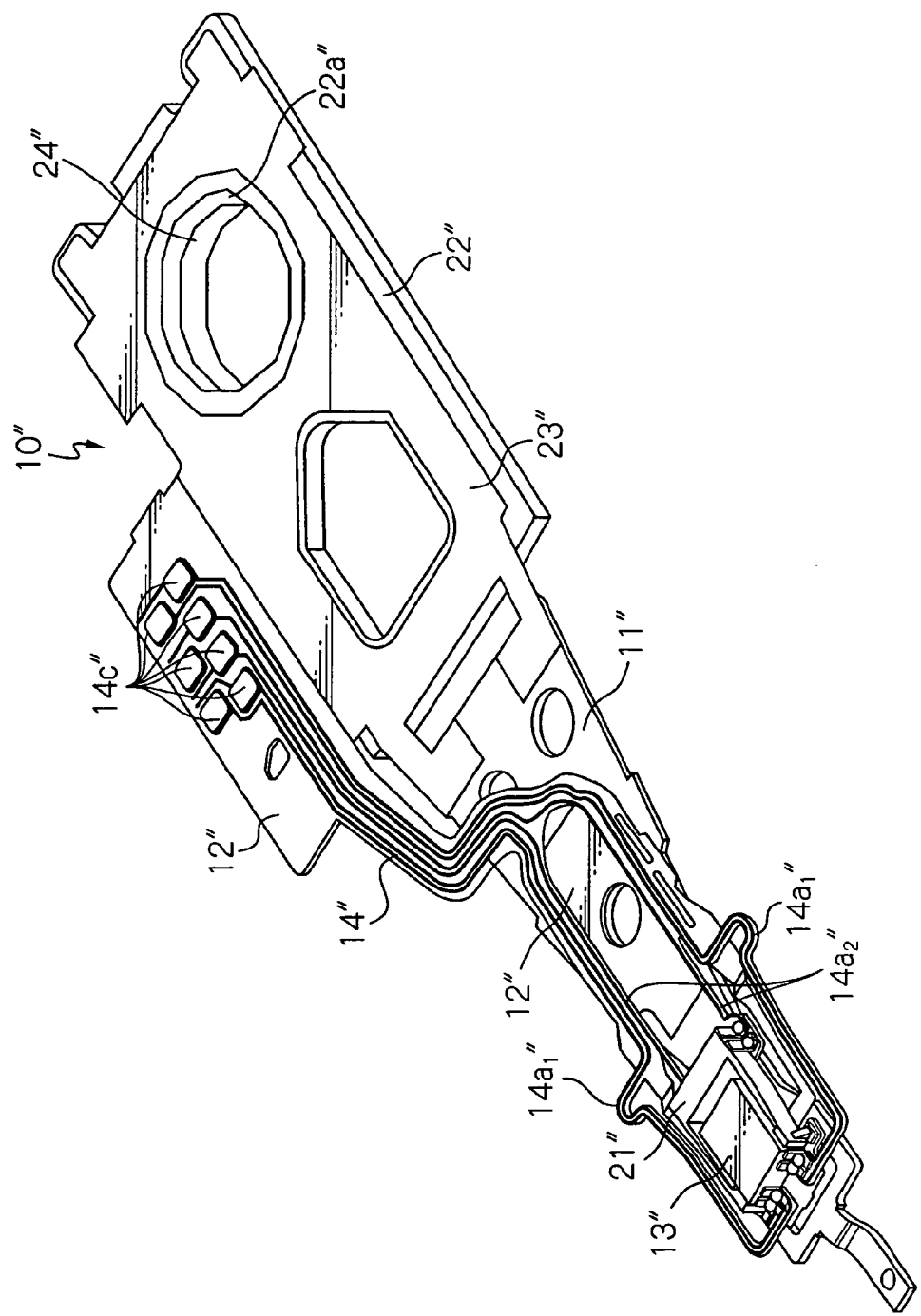
FIG. 26 is a plane view of an HGA seen from a slider-mounting side as further embodiment of a magnetic head device according to the present invention.
Figure 27:
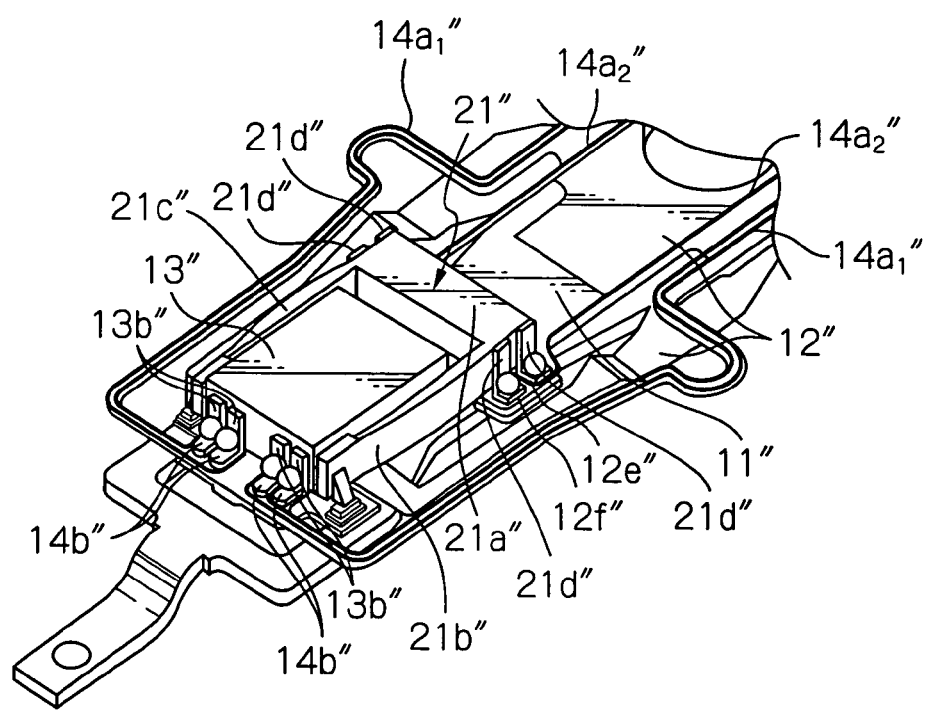
FIG. 27 is an enlarged side view of a top end section of the HGA shown in FIG. 26.

FIG. 26 illustrates an HGA seen from a slider-mounting side as further embodiment of a magnetic head device according to the present invention, and FIG. 27 shows an enlarged top end section of the HGA shown in FIG. 26.

As shown in these figures, the HGA in this embodiment has a suspension 10", a precise positioning actuator or micro-actuator 21" fixed on the suspension 10", a magnetic head slider 13" fixed on the micro-actuator 21", and a lead conductor member 14" formed on or fixed to the suspension 10".

The suspension 10" is mainly constituted by first and second load beams 22" and 11" with a relatively high stiffness, a resilient hinge 23" for coupling these first and second load beams 22" and 11", a resilient flexure 12' fixed on and supported by the second load beam 11" and the hinge 23", and a ring shaped base plate 24" attached to an attachment hole 22a" of the first load beam 22".

The micro-actuator 21" is fixed to a top end section of the suspension 10" and supports side surfaces of the magnetic head slider 13" so as to precisely position the magnetic head elements, which is not available by the VCM.

More concretely, the micro-actuator 21" in this embodiment has a rough U-plane shape and consists of a base 21a" to be fixed to the suspension 10" and a pair of movable arms 21b" and 21c" perpendicularly extending from both side ends of the base 21a". Top end sections of the movable arms 21b" and 21c" are fixed to the side surfaces of the magnetic head slider 13". The movable arms 21b" and 21c" consist of arm members and piezoelectric elements formed on side surfaces of the arm members, respectively.

The base 21a" and the arm members of the actuator 21" are united by an elastic sintered ceramic such as $ZrO_2$ for example. In response to expansion and contraction of the piezoelectric elements, the movable arm 21b" and 21c" bend resulting the top end section of the arm 21b" and 21c" to laterally displace. Thus, the magnetic head element of the magnetic head slider 13" fixed to the actuator 21" can be precisely positioned.

The second load beam 11" has a protrusion or dimple (not shown) for applying a load to the magnetic head slider 13". This dimple is positioned on the longitudinal center axis line near a free end section or top end section of the load beam 11".

The flexure 12" is formed by a thin spring plate. One surface (first surface) of the flexure 12" is attached by swaging to a surface of the second load beam 11", from which surface the protrusion juts to receive a pressed load from the protrusion. The micro-actuator 21" is attached to the other surface (second surface) of the flexure 12". Instead of swaging, the flexure 12" may be attached by spot welding to the first surface of the second load beam 11".

The flexure 12" has at its center a tongue (not shown). Top end of the protrusion of the load beam 11" abuts on one surface (first surface) of the tongue. On the other surface (second surface) of the tongue of the flexure 12", an insulation layer is formed, and on this insulation layer, a plurality of (two in this case) actuator connection pads 12e" and a plurality of (two in this case) actuator ground pads 12f" are formed. The micro-actuator 21" is electrically connected to trace conductors and mechanically fixed to the flexure 12" by solder ball connections, that is, the connection using solder balls with cores between terminal pads 21d" of the actuator 21", which are electrically connected across the piezoelectric elements, and the actuator connection pads 12e" and the actuator ground pads 12f", respectively.

The magnetic head slider 13" has a slider body 13a", a magnetic write head element of an inductive element in this embodiment, a magnetic read head element of a GMR element in this embodiment, and a plurality of (four in this case) terminal pads or bumps 13b" electrically connected to these magnetic write and read head elements.

The lead conductor member 14" has a plurality of (four in this case) head element trace conductors $14a_1$', a plurality of (two in this case) actuator trace conductors $14a_2$' one ends of which are respectively connected to the actuator connection pads 12e" and the actuator ground pads 12f", a plurality of (four in this case) head element connection pads 14b" respectively connected to one ends of the head element trace conductors 14a$_1$', and a plurality of (six in this case) external connection pads 14c" respectively connected to the other ends of the actuator trace conductors 14a$_2$'. This trace conductors 14a$_1$' and 14a$_2$' are embedded in a flexible insulation support layer of the lead conductor member 14". The head element connection pads 14b" are formed on the flexure 12" at locations corresponding to these of the terminal pads 13b" of the magnetic head slider 13", respectively.

The terminal pads 13b" of the magnetic head slider 13" and the head element connection pads 14b" of the lead conductor member 14" are solder-connected with each other by using reflowed solder balls with cores.

In this embodiment, also, solder balls with sphere cores inside, which will not melt even at a solder-melting temperature, are used as the solder balls, respectively. Structure, dimension and material of these solder balls with cores are the same as these already described in relation to FIGS. 4a and 4b.

Since the solder balls with cores, which are stable in shape are used, variations in roll angle and pitch angle of the micro-actuator 21", namely of the magnetic head slider 13" occurring during the solder connection can be reduced and stabilized. Thus, flying performance of the magnetic head slider and therefore its output characteristics can be stably kept.

Using of the solder balls with cores presents easy rework of the HGA even if the connections between the magnetic head slider and the suspension are in the reflowed state after solder reflowing. When a magnetic write head element and/or a magnetic read head element of a magnetic head slider 13" or the micro-actuator 21" is judged as malfunction at the characteristics test, the rework is done to exchange the malfunctioned magnetic head slider and micro-actuator to a new one while reusing the suspension. The rework when the connections are in the reflowed state after solder reflowing is in general performed by re-melting the solder under the reflowed state so that the micro-actuator 21" is detachable from the flexure 12" of the suspension 10". In this reworking process, since the solder balls with cores in which a balance of each core and each solder layer is appropriately determined are used, shape of each solder connection is kept in the core shape even if it is in the reflowed state. Thus, extremely easy rework process can be expected.

Also, since the solder balls are placed at corners between the second surface of the tongue of the flexure 12" and the side surfaces of the micro-actuator 21" and at corners between the second surface of the tongue of the flexure 12" and the element formed surface of the slider body 13a", heat such as laser beam heat applied from outside can be concentrated to the solder balls. Thus, during the solder reflow process for solder connections or detachment of the micro-actuator 21" and the magnetic head slider 13", possible thermal damage to the GMR element on the magnetic head slider 13" can be minimized.

Furthermore, using of the solder balls with cores presents stably kept shape and area for each solder ball to ease their control even if the connections are in pre-reflowed state before solder reflowing. Therefore, when the HGA is reworked under this pre-reflowed state, detachment of the malfunctioned micro-actuator 21" and magnetic head slider 13" from the suspension becomes greatly easier. If the HGA is judged as good at the characteristics test, the HGA will not be reworked but will be reflowed to melt the solder balls and to make solder connections.

An HAA with a support arm and the above-mentioned HGA attached to the support arm, and an HSA with a plurality of stacked HAAs can be similarly adopted as these described in reference to the first embodiment (FIGS. 6–8).

Many widely different embodiments of the present invention may be constructed without departing from the spirit and scope of the present invention. It should be understood that the present invention is not limited to the specific embodiments described in the specification, except as defined in the appended claims.

The invention claimed is:

1. A mounting method of a magnetic head component, comprising:
    providing a magnetic head slider or a precise positioning actuator with a magnetic head slider, and a suspension so as to form an exposed corner or juncture therebetween; and
    electrically and mechanically connecting said magnetic head slider or said precise positioning actuator to said suspension, by performing molten-solder connections at the corner or juncture by using solder balls exposed at the corner or juncture with cores that will not melt even at a solder-melting temperature,
    wherein said connecting of the magnetic head slider comprises performing said molten solder by laser reflowing applied to said exposed solder balls.

2. The method as claimed in claim 1, wherein the connecting of the magnetic head slider comprises placing each of said solder balls to contact at least one of a terminal pad formed on said magnetic head slider or on said precise positioning actuator and a connection pad formed on a lead conductor member supported by said suspension, and thereafter performing said molten-solder connections.

3. The method as claimed in claim 1, wherein said connecting of the magnetic head slider comprises performing said molten solder by laser reflowing applied to said exposed solder balls.

4. The method as claimed in claim 1, wherein said providing of the magnetic head or actuator comprises providing solder balls with cores, each core having a surface layer that is in contact with solder, and wherein at least said surface layer of each core is made of a conductive material.

5. The method as claimed in claim 4, wherein said conductive material contains at least copper.

6. The method as claimed in claim 1, wherein said method further comprises mechanically fixing said magnetic head slider to said suspension, by performing molten-solder connections between dummy terminal pads formed on said magnetic head slider and dummy pads formed on said suspension using solder balls with cores that will not melt even at a solder-melting temperature.

7. The method as claimed in claim 6, wherein said fixing of said magnetic head slider comprises grounding said dummy terminal pads.

8. The method as claimed in claim 1, wherein said solder balls comprise solder balls with cores, each core having a surface layer and an inside body, and wherein said surface layer of each core is made of a conductive material and said inside body of each core is made of a resin material.

9. The method as claimed in claim 8, wherein said conductive material contains at least copper.

10. The method as claimed in claim 1, wherein said solder balls comprise solder balls with cores, each core having a surface layer that is in contact with solder, and wherein at least said surface layer of each core is made of a material with a high solder wettability and a high thermal conductivity.

11. The method as claimed in claim 1, wherein said solder balls comprise solder balls with cores, each core constituting 30–70% of the whole of each solder ball by volume.

12. The method as claimed in claim 1, wherein said solder balls comprise solder balls with cores, and wherein each core has a diameter smaller than a length portion of each terminal pad formed on said magnetic head slider or on said precise positioning actuator.

13. A magnetic head device comprising:
a magnetic head slider with at least one magnetic head element and terminal pads electrically connected to said at least one magnetic head element; and
a suspension with connection pads electrically connected to said terminal pads and forming an exposed corner or juncture therebetween,
said terminal pads and said connection pads being electrically connected with each other by molten-solder connections exposed at the corner or juncture using solder balls with cores that will not melt even at a solder-melting temperature, said molten solder connections being formed by laser reflowing applied thereto.

14. The magnetic head device as claimed in claim 13, wherein each core constitutes 30–70% of the whole of each solder ball by volume.

15. The magnetic head device as claimed in claim 13, wherein said each core has a diameter smaller than a length portion of each terminal pad of said magnetic head slider.

16. The magnetic head device as claimed in claim 13, wherein said device further comprises a precise positioning actuator connected to said suspension by molten-solder connections using solder balls with cores that will not melt even at a solder-melting temperature.

17. The magnetic head device as claimed in claim 13, wherein said magnetic head slider has dummy terminal pads on a first surface thereof and said suspension has dummy pads, and wherein said dummy terminal pads and said dummy pads are electrically connected with each other by molten-solder connections using solder balls with cores that will not melt even at a solder-melting temperature.

18. The magnetic head device as claimed in claim 17, wherein said dummy terminal pads comprise grounded pads.

19. The magnetic head device as claimed in claim 17, wherein said dummy terminal pads are formed on a second surface of said magnetic head slider located at a position opposite to said first surface.

20. The magnetic head device as claimed in claim 13, wherein each core has a surface layer that is in contact with solder, and wherein at least said surface layer of each core is made of a conductive material.

21. The magnetic head device as claimed in claim 20, wherein said conductive material contains at least copper.

22. The magnetic head device as claimed in claim 13, wherein each core has a surface layer and an inside body, and wherein said surface layer of each core is made of a conductive material and said inside body of each core is made of a resin material.

23. The magnetic head device as claimed in claim 22, wherein said conductive material contains at least copper.

24. The magnetic head device as claimed in claim 13, wherein each core has a surface layer that is in contact with solder, and wherein at least said surface layer of each core is made of a material with a high solder wettability and a high thermal conductivity.

25. A manufacturing method of a magnetic head device, comprising:
placing a magnetic head slider with at least one magnetic head element and terminal pads electrically connected to said at least one magnetic head element on a suspension with connection pads so as to form an exposed corner or juncture therebetween; and
electrically connecting said terminal pads of said magnetic head slider to said connection pads of said suspension, by performing molten-solder connections at the corner or juncture by using solder balls exposed at the corner or juncture with cores that will not melt even at a solder-melting temperature,
wherein said connecting of the magnetic head slider comprises performing said molten solder by laser reflowing applied to said exposed solder balls.

26. The manufacturing method as claimed in claim 25, which further comprises testing characteristics of said magnetic head device after performing the molten-solder connections so as to judge whether the magnetic head device is defective, and reworking the magnetic head device when it is judged as defective.

27. The manufacturing method as claimed in claim 25, which further comprises testing characteristics of said magnetic head device before performing molten-solder connections where said solder balls are tentatively attached between said terminal pads and said connection pads so as to judge whether the magnetic head device is defective, and performing the molten-solder connections when the magnetic head device is judged as not being defective and performing rework of the magnetic head device when the magnetic head device is judged as being defective.

* * * * *